United States Patent [19]

Kawakubo et al.

[11] Patent Number: 5,739,563
[45] Date of Patent: Apr. 14, 1998

[54] FERROELECTRIC TYPE SEMICONDUCTOR DEVICE HAVING A BARIUM TITANATE TYPE DIELECTRIC FILM AND METHOD FOR MANUFACTURING THE SAME

[75] Inventors: Takashi Kawakubo, Yokohama; Kenya Sano; Kazuhide Abe, both of Kawasaki; Shuichi Komatsu, Yokohama; Noburu Fukushima, Tokyo; Kazuhiro Eguchi, Yokohama, all of Japan

[73] Assignee: Kabushiki Kaisha Toshiba, Kawasaki, Japan

[21] Appl. No.: 559,945

[22] Filed: Nov. 17, 1995

[30] Foreign Application Priority Data

Mar. 15, 1995 [JP] Japan ................................. 7-082091
Sep. 11, 1995 [JP] Japan ................................. 7-232509

[51] Int. Cl.$^6$ .......................... H01L 29/94; H01L 27/108
[52] U.S. Cl. ........................... 257/295; 361/321.5; 437/43
[58] Field of Search ........................... 257/295; 361/321.5; 437/43

[56] References Cited

U.S. PATENT DOCUMENTS 5,229,309   7/1993   Kato ................................. 257/295
5,440,173   8/1995   Evans et al. ....................... 257/295
5,578,850   11/1996  Fitch et al. ....................... 257/296

OTHER PUBLICATIONS

Iijima et al *Appl Phys. Lett.* 56 No. 6 5 Feb. 1990 "Preparation . . . BaTiO$_3$ ., Evaporation" pp. 527–529.

Terauchi et al *Journal of The Physical of Japan* vol. 61 No. 7 Jul. 1992 pp. 2194–2197 "Structured . . . BaTiO$_3$ Crystals".

Primary Examiner—Jerome Jackson
Attorney, Agent, or Firm—Finnegan, Henderson, Farabow, Garrett & Dunner, L.L.P.

[57] ABSTRACT

A semiconductor memory device comprising a silicon substrate, a plurality of switching transistors formed on the silicon substrate, an insulating layer having an opening and formed on a surface portion of the silicon substrate where the plurality of switching transistors formed, and a plurality of capacitors for accumulating electric charge formed on the insulating layer and connected respectively to the switching transistors via a conductive film buried in the opening of insulating layer, wherein each of the capacitors for accumulating electric charge is provided with an underlying crystal layer formed on the insulating layer and with a dielectric film consisting essentially of a ferroelectric material and epitaxially or orientationaly grown on the underlying crystal layer, and the switching transistors and the capacitors for accumulating electric charge connected to each other constitute a plurality of memory cells arranged in a two-dimensional pattern.

17 Claims, 11 Drawing Sheets

FERROELECTRIC TYPE SEMICONDUCTOR DEVICE HAVING A BARIUM TITANATE TYPE DIELECTRIC FILM AND METHOD FOR MANUFACTURING THE SAME

BACKGROUND OF THE INVENTION

1. Field of the Invention

This invention relates to a semiconductor memory device provided with a thin film capacitor employing a dielectric film made of a ferroelectric material, and to a method of manufacturing such a semiconductor memory device.

2. Description of the Related Art

Over the past few years, the development of a semiconductor memory device using a ferroelectric thin film as a dielectric film for a capacitor of memory cell (ferroelectric memory) has been studied and some of them are now actually utilized. This ferroelectric memory is of nonvolatile type, having various features that an information stored therein would not vanish even if power source is cut off, and that the inversion of residual polarization is very rapid if the thickness of the ferroelectric thin film is fairly thin, so that a rapid writing and readout which are comparable to DRAM (volatile memory) can be realized. Moreover, since one unit memory cell can be constituted by a single transistor and a single capacitor, the ferroelectric memory is suited for mass storage.

Recently, a technique of operating the ferroelectric memory like DRAM has been studied. According to this technique, the residual polarization of the ferroelectric thin film is not caused to inverse during the ordinary operation, but the ferroelectric thin film is utilized in the same manner as the capacitor of memory cell of DRAM and actuated only when the power source of machine is to be cut off as a nonvolatile memory by making the most of the residual polarization of the ferroelectric thin film. This technique is an effective method of avoiding the fatigue of the ferroelectric thin film, i.e. a phenomenon that the ferroelectric thin film is degraded upon the repetition of inversion of polarization, which is considered to be one of the most important problems in the ferroelectric memory.

It is demanded for a ferroelectric thin film that can be suitably used as a ferroelectric memory to have a large residual polarization, and to be minimal in temperature dependency of the residual polarization as well as in degradation resulting from the repetition of inversion of polarization. Additionally, it is also demanded for the ferroelectric thin film to have minimal leak current if the ferroelectric memory is to be operated like a DRAM.

As a dielectric material to be used as a ferroelectric thin film mentioned above, lead zirconate titanate (PZT) having a perovskite crystal structure is commonly employed at present. This PZT is a solid solution of lead zirconate ($PbZrO_3$) and lead titanate ($PbTiO_3$), a solid solution consisting of lead zirconate and lead titanate at a molar ratio of 1:1 being considered to be most excellent as it is large in residual polarization and capable of inverting polarization at a low electric field. Additionally, since the transition temperature (Curie point) between the ferroelectric phase and paraelectric phase of the PZT is as high as about 300° C., there is little possibility that an information stored in the memory can be thermally vanished, even if it is exposed to a temperature of not more than 120° C., i.e. a temperature range in which an ordinary electric circuit is generally operated.

However, it is well known in the art that the formation of thin film of PZT of high quality is very difficult. A first reason for this difficulty is that Pb which is a main component of PZT is more likely to be evaporated at a temperature of 500° C. or more, resulting in the difficulty of accurately controlling the composition of film to be formed. A second reason for this difficulty is the fact that PZT exhibits ferroelectricity only when it is in the state of perovskite structure, but depending on the film-forming conditions, a pyrochlore crystal structure exhibiting no ferroelectricity may more likely be formed instead of the perovskite structure. It is generally required for the formation of a PZT thin film having the perovskite structure to perform the film-formation at a temperature of 500° C. or more. However, if the temperature is raised to 500° C. or more, Pb is more likely to be evaporated as mentioned above thereby giving rise to a problem that a PZT film of desired composition can not be obtained.

In spite of the fact that it is very difficult to form in good reproducibility a PZT film of desired composition as mentioned above, PZT is now most commonly employed as a dielectric material for the formation of ferroelectric thin film of a ferroelectric memory. This is because there is no suitable dielectric material other than PZT at present. For example, in addition to PZT as a dielectric material, barium titanate ($BaTiO_3$) is well known as a material exhibiting ferroelectricity. Moreover, since Ba is not so easily evaporated as compared with Pb, the control of composition in the formation of $BaTiO_3$ thin film is comparatively easy, and at the same time there is little possibility in the formation of $BaTiO_3$ thin film that a different crystal structure (such as a pyrochlore crystal structure) other than perovskite structure can be formed.

In spite of these advantages of $BaTiO_3$ thin film, the $BaTiO_3$ thin film is not so studied as a candidate for the dielectric material for the formation of ferroelectric thin film for a ferroelectric memory. The reasons of this fact can be ascribed to a low residual polarization of the $BaTiO_3$ thin film as compared with PZT thin film and to the fact that the magnitude of residual polarization of the $BaTiO_3$ thin film depends greatly on temperature. The basic reason for this can be ascribed to the fact that the Curie point of $BaTiO_3$ is inherently comparatively low, or about 120° C. This Curie point is a temperature inherent to a dielectric material which undergoes a phase change from a ferroelectric phase to a paraelectric phase. Even for a electric material capable of exhibiting ferroelectricity, if the dielectric material is heated to a temperature higher than the Curie point thereof, the dielectric material is no longer capable of exhibiting a ferroelectricity. Therefore, if $BaTiO_3$ is employed as a dielectric material in a ferroelectric memory and the ferroelectric memory is happen to be exposed to a high temperature of 120° C. or more, an information being stored in the ferroelectric memory may vanish. In addition to that, since the temperature dependency of residual polarization at the capacitor of such a ferroelectric memory is relatively large even in a temperature range of 85° C. or less, i.e. a temperature range to which an electronic circuit is commonly exposed, the operation of the ferroelectric memory may become unstable. Accordingly, the $BaTiO_3$ thin film is conventionally considered as being unsuitable for use for a capacitor of a ferroelectric memory.

Meanwhile, it is recently reported by Iijima et al in "Applied Physics, Vol. 62, No. 12 (1993), p. 1250–1251" that there was observed a phenomenon that the Curie point of $BaTiO_3$ thin film was raised up to 200° C. when the $BaTiO_3$ thin film was epitaxially grown on a singlecrystal substrate of Pt/Mg. According to this publication, this phenomenon is explained that the thin film of $BaTiO_3$ was epitaxially grown in conformity with the lattice constant of Pt so that a-axis of the lattice having perovskite crystal structure was shortened and at the same time c-axis thereof was elongated. However, this raise in Curie point was observed on a BaTiO$_3$ thin film of extremely small thickness. If the thickness of a BaTiO$_3$ thin film is as thick as not less than 10 nm for example, the lattice forming a perovskite crystal structure through misfit transition may be more likely to be returned to the original lattice constant inherent to the BaTiO$_3$, thus making it impossible to expect a raise in Curie point.

It is generally considered that in the case of a ferroelectric thin film having a thickness of not more than 15 m, the thinner the ferroelectric thin film becomes, the smaller the resulting residual polarization. As a matter of fact, it is described in the publication that the residual polarization of a BaTiO$_3$ thin film having a thickness of not more than 100 nm is 2 to 3 µC/cm$^2$ or less. Accordingly, even if the Curie point of BaTiO$_3$ could be raised with a BaTiO$_3$ thin film having a thickness of 10 nm or less, a BaTiO$_3$ thin film having a sufficient residual polarization for practical use would never be obtained. In view of this, the application of a BaTiO$_3$ thin film for a capacitor of a ferroelectric memory would be very difficult.

On the other hand, it is recently studied to employ a dielectric material of a perovskite structure having a large dielectric constant in place of the conventional silicon oxide (SiO$_2$) or silicon nitride (Si$_3$N$_4$) in order to cope with recent trend even in the ordinary Dram to further increase the integration thereof. Namely, the employment of a dielectric material of a perovskite structure having a Curie point of not more than the room temperature and exhibiting no ferroelectricity such as strontium titanate (SrTiO$_3$) or calcium titanate (CaTiO$_3$) has been studied for the formation of a capacitor of a memory cell in order to increase the capacity and minimize the occupying area of the capacitor. However, even with these dielectric materials having a perovskite structure, it still fails to obtain a large capacity that might be expected from the dielectric constant inherent to these dielectric materials even if they are formed into a thin film. Additionally, there is another problem of the temperature dependency of the capacity. In view of these problems, these dielectric materials are not yet put to practical use in DRAM.

On the other hand, SrTiO$_3$, BaTiO$_3$, PbTiO$_3$, PbZrO$_3$ are known as having dielectric constant of 100 or more, or up to 1,000 in a single composition thereof or in combination thereof as a solid solution so that they are extensively utilized as a bulk material in a ceramic capacitor.

However, if these dielectric materials such as SrTiO$_3$ are simply made into a thin film in order to increase the capacity thereof, the dielectric constant thereof would be gradually lowered thus raising a problem. For example, in the case of Ba$_{1-x}$Sr$_x$TiO$_3$ whose dielectric constant exceeds well over 1,000 when used as a bulk material, the dielectric constant thereof may be lowered to about 250 when the film thickness thereof becomes 30 nm, so that the SiO$_2$conversion film thickness thereof may be about 0.4 nm at most. Therefore, if a DRAM in the order of 1 G bit is to be manufactured, the magnitude of stored charge may become insufficient if a thin film capacitor using the BaSrTiO$_3$ dielectric film is flatly formed, so that the capacitor is required to be formed in a three-dimensional shape having an aspect ratio of 2 or more, thus making it more difficult to manufacture the capacitor.

The same problem as mentioned above may be raised in the manufacture of a semiconductor memory device using a ferroelectric thin film, i.e. a ferroelectric memory such as an FRAM. For example, in the case of PbZr$_{1-x}$TixO$_3$ thin film now utilized in an FRAM, when the thickness of this thin film becomes thinner, the ferroelectricity is more likely to vanish, so that a film thickness of at least 200 nm is required. However, if such a thick dielectric film is to be employed, the increase of integration would become very difficult.

Moreover, in the case of crystalline dielectric material, the characteristics of the material depend largely on the crystal structure or composition thereof. Therefore, if such a material is to be used as a capacitor of a memory cell, a non-uniformity in capacity of the capacitor may be caused among the memory cells unless the crystal structure or composition is accurately controlled at the time of forming the film, thus deteriorating the reliability of the resultant semiconductor memory device. Up to date however, an effective technique which is capable of increasing the integration of device while inhibiting such a non-uniformity in capacity of the capacitor among the memory cells in the manufacture of a semiconductor memory device using a crystalline dielectric material as a capacitor of a memory cell is not yet accomplished.

As for a ferroelectric thin film to be used in this case, a high performance thereof is demanded with respect to residual polarization, coercive electric field or fatigue resistance for the purpose of achieving a desired function of the ferroelectric memory. For example, the writing and readout of the memory mean a repetition of the accumulation and release of electric charges by the ferroelectric thin film, so that a fatigue such as a decrease in coercive electric field or residual polarization as a result of such a repetition has now become a problem. One of the cause for this fatigue is the pinning of the dielectric domain due to the electric charges accumulated at the interface between the dielectric thin film and the electrodes. If an electrode material having a little possibility of generating a boundary charge is employed in order to decrease the pinning, another problem of increasing leak current may be raised.

Meanwhile, there has been developed, for the purpose of alleviating the fatigue mentioned above, a technique of performing non-destructive reading wherein the readout of an information is performed by applying an electric field which is sufficiently low enough to avoid the inversion of polarization, i.e. an electric field of not more than coercive electric field to a DRAM to actuate it. In this case however, the accumulated electric charge available for the readout of an information may be decreased, so that the capacity of the capacitor may be required to be further increased, thus necessitating the employment of a dielectric material of more excellent properties.

Further, there is a problem of the increase in leak current in the ferroelectric memory, if the film thickness of the ferroelectric thin film is made thinner for realizing an increase in integration of elements. At the same time, when the ferroelectric thin film is thinned in this manner, the fatigue mentioned above may be also made conspicuous. As explained above, in the case of a thin film capacitor using a ferroelectric thin film, there are some self-contradiction with respect to the thickness of the film, hence it has been very difficult to obtain a ferroelectric memory which is excellent in all respects, e.g. small in size, large in residual polarization and minimal in leak current.

As explained above, it is possible, with the employment of a dielectric film having a perovskite crystal structure that can be used as a thin film capacitor of a ferroelectric memory or a DRAM for example, to raise the Curie point thereof by epitaxially growing it and by thinning the film thickness.

However, if the film is thinned in this manner, not only the residual polarization thereof become small, but also a sufficient capacity that might be expected from the dielectric constant inherent to the dielectric material cannot be obtained even if it is formed into such a thin film. Additionally, there is another problem of the temperature dependency of the capacity. In view of these problems, it has been considered that even if the dielectric film having a perovskite crystal structure is applied to a thin film capacitor, it is impossible to realize a sufficient effect.

As explained above, there is a fundamental important problem in the use of a dielectric film having a perovskite crystal structure that when the dielectric film is made thinner, the dielectric characteristics of the dielectric film is deteriorated, thus giving rise to a problem in its use as a capacitor of memory cell, of a semiconductor memory device. It is very important in the use of such a crystalline dielectric material for a capacitor of memory cell to inhibit the non-uniformity in capacity of the capacitor among memory cells in order to assure the reliability of a semiconductor memory device. Additionally, in the case of a ferroelectric memory such as FRAM utilizing the residual polarization thereof as a fundamental principle of memory, there is a problem of fatigue such as the decrease of coercive electric field or residual polarization.

SUMMARY OF THE INVENTION

Therefore, an object of this invention is to provide a semiconductor memory device comprising a thin film capacitor with a dielectric film, which exhibits an improved ferroelectric property, and being capable of enhancing the integration.

A further object of this invention is to provide a semiconductor memory device which is capable of enhancing the integration of the memory device, of minimizing the non-uniformity in capacity of the capacitor among memory cells, of assuring a large residual polarization in the capacitor, of securing a stable operation, and of assuring a large capacity of the capacitor over a wide range of temperature.

Another object of this invention is to provide a semiconductor memory device comprising a thin film capacitor which is free from a fatigue such as the lowering of residual polarization of a thin capacitor resulting from the readout of stored information or the lowering of coercive electric field.

A further object of this invention is to provide a method of manufacturing a semiconductor memory device mentioned above.

According to the present invention, there is provided a semiconductor memory device comprising a silicon substrate, a plurality of switching transistors formed on the silicon substrate, an insulating layer having an opening and formed on a surface portion of the silicon substrate where the plurality of switching transistors formed, and a plurality of capacitors for accumulating electric charge formed on the insulating layer and connected respectively to the switching transistors via a conductive film buried in the opening of insulating layer, wherein each of the capacitors for accumulating electric charge is provided with an underlying crystal layer formed on the insulating layer and with a dielectric film consisting of a ferroelectric material and epitaxially or orientationaly grown on the underlying crystal layer, and that the switching transistors and the capacitors for accumulating electric charge connected to each other constitute a plurality of memory cells arranged in a two-dimensional pattern.

Further, according to the present invention, there is provided a semiconductor memory device comprising a silicon substrate, a plurality of switching transistors formed on the silicon substrate, an insulating layer having an opening and formed on a surface portion of the silicon substrate where the plurality of switching transistors formed, and a plurality of thin film capacitors formed on the insulating layer and connected respectively to the switching transistors via a (100) plane-oriented silicon layer buried in the opening of insulating layer, wherein each of the thin film capacitors is provided with the (100) plane-oriented silicon layer formed on the insulating layer and with a dielectric film consisting of a crystalline dielectric material and epitaxially grown on the oriented silicon layer, and that the switching transistors and the thin film capacitors connected to each other constitute a plurality of memory cells arranged in a matrix pattern.

Still further, according to the present invention, there is provided a method of manufacturing a semiconductor memory device comprising a plurality of memory cells which are two-dimensionally arranged, each memory cell being constituted by a single switching transistor and a single capacitor having a dielectric film for accumulating electric charge; the method comprising the steps of; forming a plurality of switching transistors on a semiconductor substrate; forming an insulating layer on a surface of the semiconductor substrate to cover the plurality of switching transistors formed thereon; forming an opening in the insulating layer; forming a (100) plane-oriented silicon layer over the semiconductor substrate exposed in the opening of the insulating layer to extend through the opening over the insulating layer; and epitaxially growing a dielectric film consisting of a crystalline dielectric material on the (100) plane-oriented silicon layer.

Still further, according to the present invention, there is provided a method of manufacturing a semiconductor memory device comprising a plurality of memory cells which are two-dimensionally arranged, each memory cell being constituted by a single switching transistor and a single capacitor for accumulating electric charge; the method comprising the steps of; forming a plurality of switching transistors on a semiconductor substrate; forming an insulating layer on a surface of the semiconductor substrate to cover the plurality of switching transistors formed thereon; forming an opening in the insulating layer; forming a conductive plug consisting essentially of amorphous or polycrystalline material in the opening of the insulating layer; forming an underlying crystal layer on the plugs; and epitaxially or orientationaly growing a dielectric film consisting essentially of a ferroelectric material on the underlying layer to a capacitor for accumulating electric charge.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1:
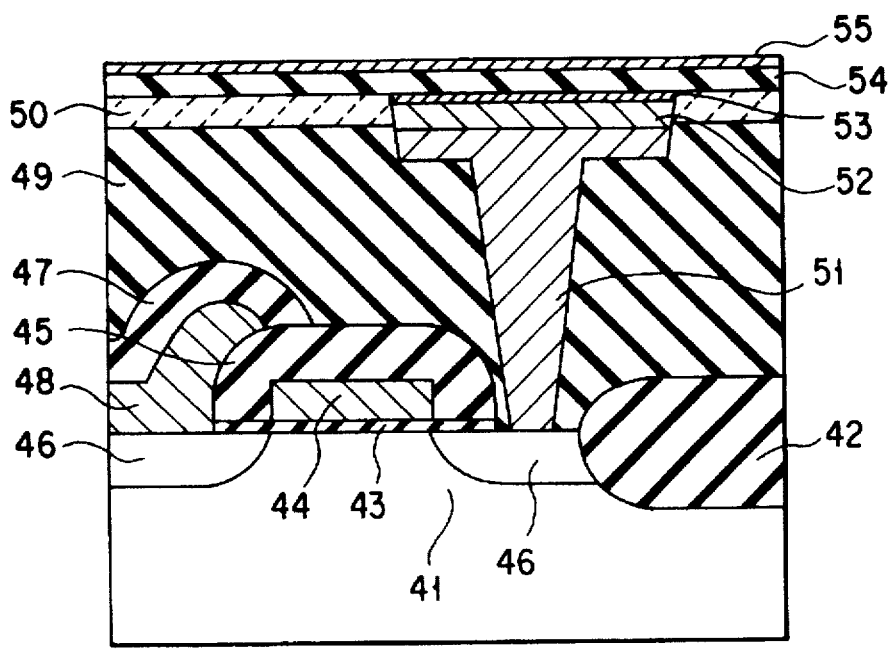
FIG. 1 is sectional view of a dynamic access memory (DRAM) of Example 1.

This invention will be further explained with reference to the following preferred embodiments.

This invention provides a semiconductor memory device wherein a plurality of memory cells, each comprising one switching transistor and one capacitor for accumulating electric charge are arranged in a two-dimensional pattern on a semiconductor substrate, and a ferroelectric material is employed as a dielectric film of the capacitor, which is characterized in that the dielectric film is epitaxially or orientationaly grown on an underlying crystal which has been grown via a conductive film from the substrate.

The semiconductor memory device according to this invention can be manufactured by a process comprising the steps of; forming a switching transistor on a surface of the semiconductor substrate; forming an insulating film to cover a surface portion of the semiconductor substrate where the switching transistor is disposed; forming an opening in the insulating film; forming a conductive plug in the opening of insulating layer, the plug being formed to contact with the substrate; forming an underlying crystal layer on the insulating film, the underlying crystal layer being formed to contact with the plug; and forming the dielectric film by epitaxially or orientationaly growing a dielectric material on the underlying layer.

Preferable embodiments of the semiconductor memory device according to this invention would be exemplified as follows.

(1) The conductive plug buried in the opening of the insulating film is a silicon layer having a (100) plane, and underlying crystal layer formed in contact with the plug is epitaxially or orientationaly grown inheriting the crystal orientation from the plug.

(2) The (100) plane-orientated silicon layer is a single-crystalline silicon layer.

(3) The (100) plane-orientated silicon layer or the single-crystalline .silicon layer is formed by a selective growth on the silicon substrate, or is formed by singlecrystallizing an amorphous silicon through solid phase growth from the silicon substrate.

(4) A barrier or lower electrode is epitaxially grown between the (100) plane-orientated silicon layer and the dielectric film to prevent mutual diffusion.

In the above embodiments, the underlying crystal layer and dielectric film are epitaxially grown utilizing (100) plane-orientated plug selectively grown through opening of the insulation film on the substrate.

The other preferable embodiments would be exemplified as follows.

(5) The underlying crystal is a singlecrystal prepared by way of a crystal growing method for allowing a crystal growth to proceed from a seed crystal to lateral direction (lateral overgrowth method).

(6) The surface of the amorphous underlying substrate is made into a corrugated surface, and the singlecrystalline underlying crystal is formed by way of graphoepitaxial method.

In the above embodiments, the singlecrystalline underlying crystal layer is formed on the insulating film by the lateral overgrowth method or graphoepitaxial method without using the (100) plane-orientated silicon plug.

More preferable embodiments would be exemplified as follows.

(7) Each capacitor is formed on the surface of an isolated individual underlying crystal.

(8) The crystal, on which the capacitor is formed, is singlecrystal.

(9) The crystal, on which the capacitor is formed, is oriented in a specific direction of crystal axis on the amorphous underlying substrate.

More preferable embodiments with respect to the dielectric film according to this invention would be exemplified as follows.

(10) The ferroelectric material is a dielectric body having a high dielectricity or a ferroelectric body, each having a perovskite or a layered perovskite structure.

(11) The lattice constant (ad) of the perovskite type ferroelectric material and the lattice constant (as) of the lower electrode contacting with the ferroelectric material satisfy the relationship: $1.002 < ad/as < 1.03$.

According to the conventional method, even if a dielectric material having perovskite crystal structure is employed for a charge storage element of a semiconductor memory device, it has been difficult to enhance the integration of the memory cell due to the deterioration of dielectric properties resulting from the thinning of dielectric film. Whereas, according to this invention, it is possible, through the use of a dielectric film epitaxially grown on the crystal habit surface of the underlying crystal, to induce an increase in accumulated electric charge and a ferroelectricity by making the most of the constraint in relative to the underlying film, to minimize the non-uniformity in capacity of the capacitor among the memory cells, and to repress diffusion of components of the dielectric film and the lower electrode due to intergranular diffusion, thereby making it possible to manufacture a highly integrated semiconductor memory device.

The basic principle of this invention is as follows.

In an effort to solve the above-mentioned problem, the present inventors has first noticed the employment of an epitaxially grown film as a dielectric film for a memory cell. It has been found through experiments performed by the present inventors that when a $Ba_xSr_{(1-x)}TiO_3$ dielectric film is epitaxially grown on a MgO substrate having (100) plane through a platinum electrode layer, a phenomenon that a ferroelectricity develops even in the condition of x>0.4, in other words a phenomenon that the Curie point for allowing a paraelectric material to be converted into a ferroelectric material is increased by 200° C. or more has been recognized. In addition to that, a phenomenon that the amount of accumulated charge is also increased by 20 to 200% has been recognized. These phenomena are quite surprising in view of the conventional knowledge that in the case of the conventional bulk material, the ferroelectricity can be developed only when the molar fraction of barium x is 0.7 or more.

As result of profound study on the cause of prominently improving the dielectric properties, the followings have been found. Namely, it has been found that a Pt (100) plane was epitaxially grown on the MgO (100) plane substrate, and moreover, a $BaSrTiO_3$ (100) 10 plane was epitaxially grown thereon. Since the $BaSrTiO_3$ (100) spacing is slightly larger than the Pt (100) spacing, the $BaSrTiO_3$ is caused to be compressed in the in-plane direction as the $BaSrTiO_3$ is epitaxially grown on the Pt. As a result, a residual elastic strain acting to extend the grown layer in the direction perpendicular to the plane is produced, and the ferroelectricity is induced by this residual elastic strain.

Therefore, when a perovskite film which has been epitaxially grown is employed as a capacitor of memory cell, it is possible to make the most of the ferroelectricity induced by the restraint from the underlying film as well as the increase of dielectric constant. Further, since the direction of polarization of the perovskite crystal is (100) plane, it is possible, through this orientation in the direction of (100) plane, to obtain a semiconductor memory device which is minimal in non-uniformity among cells as compared with that of polycrystalline film and is suited for enhancing the integration of the memory cells.

Likewise, when a Pt (110) plane was epitaxially grown on the MgO (110) plane substrate, and then, a $BaSrTiO_3$ (110) plane was epitaxially grown thereon to obtain a capacitor film, its dielectric properties were measured. As a result, it was possible to obtain prominent ferroelectric properties though the properties obtained were somewhat inferior as compared with the capacitor formed on the MgO (110) plane substrate.

On the other hand, the epitaxial growth of the (111) plane of $BaSrTiO_3$ is somewhat difficult due to its large surface energy. However, it is possible to epitaxially grow the (111) plane of $BaSrTiO_3$ on a Pt (111) plane which has been formed in advance on the surface of the MgO (111) plane substrate by optimizing the film-forming conditions of sputtering for example thereby to obtain a capacitor having prominent ferroelectric properties likewise.

When a semiconductor substrate mounted thereon with a switching transistor is to be actually combined with a capacitor comprising a perovskite type dielectric material, the capacitor should be formed on the substrate by interposing an insulating layer therebetween. The insulating layer now commonly employed are all glass (amorphous) film formed of an oxide or nitride of silicon having phosphorus or boron mixed therein. Therefore, it is impossible to prepare a thin film capacitor by epitaxially growing a dielectric film on the insulating layer. It is also very difficult to adopt a MgO substrate in a silicon device.

Therefore, according to this invention, a suitable crystal habit surface of an underlying crystal formed on an amorphous material is utilized, i.e. a laminated structure comprising the crystal habit surface, underlying electrode formed on the crystal habit surface and an epitaxially grown or oriented dielectric film is formed. The underlying crystal grown on an amorphous material should desirably be a singlecrystal which is oriented as a whole or an oriented crystal. However, as in the case where the individual underlying crystal of capacitor is composed of a single crystal grain, if a suitable crystal habit surface of the crystal grain can be utilized, the orientation direction of individual crystal is not necessarily required to be uniform as a whole.

The present inventors have found that a (100) plane-orientated or singlecrystalline silicon plug formed by selective growth method in an opening of an insulating layer can be used to form an orientated or singlecrystalline underlying crystal on an amorphous insulating layer formed on a silicon substrate.

Namely, a silicon singlecrystal is grown through a contact hole formed at a portion of a silicon substrate covered with an insulating layer to such an extent to cover the surface of the insulating layer with the silicon singlecrystal thereby forming a (100) plane-oriented silicon layer. Therefore, a dielectric film can be epitaxially grown through this (100) plane-oriented silicon layer.

It is not necessarily required to selectively grow a singlecrystalline silicon layer free from sub-crystal boundary, but the singlecrystalline silicon layer may include sub-crystal boundary as far as the single-crystalline silicon layer is sufficiently oriented in the direction of (100) plane to allow an epitaxial growth of a dielectric film thereon. To be more specific, it is possible according to this invention to employ an epitaxially grown dielectric film as long as the peak of (100) plane or of those corresponding to a multiple of that exhibits a magnitude 5 times, preferably 10 times as high as that of the peak of (110), (211) or (111) as measured with an X-ray diffraction according to the θ-2θ method. It is also preferable to select a dielectric film wherein the half-value breadth of rocking curve of the peak of (200) plane thereof is 2° or less, preferably 1° or less as measured with an X-ray diffraction.

The formation of a singlecrystalline silicon layer through a contact hole formed at a portion of the silicon substrate may be performed by selectively growing (in relative to a silicon oxide layer) singlecrystalline silicon layer directly on the silicon substrate, or by selectively growing (in relative to a silicon oxide layer) an amorphous silicon on the silicon substrate in advance and then annealing the amorphous silicon thereby causing a solid-phase growth of singlecrystal beginning from the boundary region thereof with the silicon substrate. In the process of forming a memory cell on the singlecrystalline silicon layer, the upper surface of the singlecrystalline silicon layer may be flattened by way of a chemo-mechanical polishing method (CMP).

It is preferable in order to avoid a counter diffusion between the singlecrystalline silicon layer and the dielectric film to interpose a metallic film or an insulating film having an excellent barrier properties as a barrier between the singlecrystalline silicon layer and the dielectric film. Examples of metallic film having barrier properties are a silicide of nickel or cobalt, and a nitride of titanium or tungsten, lattices of which are substantially matchable with the lattice of silicon. In the case of silicides, they may be formed by subjecting the surface of the singlecrystalline silicon layer to a reaction with cobalt or nickel. As for the insulating film having barrier properties, a fluoride of calcium or an oxide of cerium or magnesium, lattices of which are substantially matchable with the lattice of silicon, may be employed. When a barrier layer is to be interposed in this manner, the kind of material and thickness of the barrier layer should be suitably selected so as not to hinder the (100) plane-orientation of the dielectric film.

If desired, a singlecrystalline silicon layer doped with an impurity may Of course be employed also as a interconnecting layer (storage node) electrically connecting one of the electrodes of a switching transistor formed on the substrate with one of the electrodes of the capacitor. In this case, it is required that the barrier interposed between the singlecrystalline silicon layer and the dielectric film is made of a conductive material.

It is also possible to employ another interconnecting wiring for connecting one of the electrodes of a switching transistor with one of the electrodes of the capacitor. In this case, a portion of the singlecrystalline silicon layer formed in advance may be removed for forming the interconnecting wiring.

As another method for growing a singlecrystal on the surface of an amorphous material, the lateral overgrowth method which allows a crystal growth to be proceeded from a seed crystal to lateral direction to be fusion-recrystalized may be adopted. Alternatively, a method wherein an amorphous film is grown from a seed crystal to the lateral direction in the form of solid growth can be adopted. The heating means useful in this case may be a method of scanning laser beams or electron beams in the direction of crystal growth or a method of uniform heat-treatment (when the growing distance is small).

As another method for growing a singlecrystal on the surface of an amorphous material, a method of utilizing a corrugated surface which has been artificially formed in advance on an underlying substrate (graphoepitaxial method) may be employed. For example, if a cubic (100) singlecrystal is to be prepared, a groove-like relief having a rectangular sectional shape is formed in advance on the surface of the underlying surface, and then a material intended is deposited thereon to be subsequently recrystalized or solid-phase recrystalized, thereby obtaining the singlecrystal. As for the other surface of the substrate, a similar relief is formed on the surface in conformity with the angle of the plane, and then a singlecrystal can be formed in the same manner as mentioned above.

As a method for growing an oriented underlying crystal on an amorphous material, a method of growing the crystal by making use of the crystal habit surface of a crystal may be employed. For example, the (111) plane of a face centered cubic crystal, the (110) plane of a body centered cubic crystal or the (0001) plane of a hexagonal close-packed crystal may be grown, orienting it with the underlying surface.

With the employment of a selective CVD growth method, a mono-nucleus growth of crystal corresponding with the individual capacitor can be performed. Namely, first, minute regions for easily allowing the generation of nucleus, which correspond respectively to the regions for forming a capacitor are formed together with regions which hardly allow the generation of nucleus, and then the mono-nucleus growth is performed under the condition where the density of nucleation is sufficiently smaller than the minute region for generating nucleus, whereby forming a singlecrystal as an underlying crystal for the individual capacitor.

As for the underlying region for effecting the selectivity, it may be formed by making use of a difference in material, for example a difference between an insulating material and a conductive material. Alternatively, a method of performing a selective ion-implantation on the region for generating nucleus may be adopted. When the region for generating nucleus is formed by way of ion-implantation on an insulative underlying layer or on a semiconductor underlying layer, the region thus formed may be utilized also as interconnecting plug for obtaining a connection with a transistor. Materials which can be used in the selective CVD growth are well known and can be used in the same manner, examples thereof being a semiconductor crystal such as Si, GaAs, GaN or SiC; a metallic crystal such as W, Cu or Al; and a silicide.

As an alternative method of performing a mononucleus growth of crystal corresponding with the individual capacitor, the following method can be employed. Namely, first, minute crystalline regions corresponding respectively to the regions for forming a capacitor are formed together with other amorphous regions, then an amorphous film is deposited thereon, and then a solid phase growth is allowed to develop through heat treatment from an interface between the minute crystalline regions and the amorphous region, whereby forming a singlecrystalline underlying layer for the individual capacitor. If desired, a lithographic treatment can also be performed after the solid-phase growth.

As another method of performing a mono-nucleus growth of crystal corresponding with the individual capacitor, the following method can be employed. Namely, first, an amorphous film is formed all over the surface, an ion-implantation is performed in minute regions corresponding respectively to the regions for forming a capacitor, thereby making it easy to develop the mono-nucleus crystal growth, and then a singlecrystal growth of nucleus is allowed to develop through heat treatment from the ion-implanted regions, whereby forming a singlecrystalline underlying layer for the individual capacitor. If desired, a lithographic treatment can also be performed after the crystal growth of nucleus.

With respect to the crystal habit surface of the underlying crystal, a crystal habit surface that can be spontaneously formed at the time of forming a film by way of CVD or sputtering, a crystal habit surface that can be prepared by the treatment of a crystal film through a selective etching, or a crystal habit surface that can be formed by chemomechanical abrasion of a specific plane of crystal may be employed.

If a film of perovskite structure such as $BaSrTiO_3$ is employed as a ferroelectric film, the employment, as a crystal habit surface of the underlying crystal, of a rectangular lattice plane such as the (100) or (110) plane of cubic system or tetragonal system is preferable in view of the easiness of its epitaxial growth on the (100) or (110) plane. However, since the $BaSrTiO_3$ and the like is large in polarization in the direction of (111) plane and can be epitaxially grown depending on the film-forming conditions, it is also possible to employ a crystal habit surface having an equilateral triangular lattice plane such as the (0001) plane of hexagonal crystal system or the (111) plane of cubic crystal system. Additionally, as a crystal habit surface of the underlying crystal for a capacitor, it is also possible to employ a plurality of crystal habit surfaces.

The underlying crystal may be conductive so as to be used also as a lower electrode. If an insulative underlying crystal is employed, the ferroelectric film is required to be formed on the underlying crystal through a lower electrode, and at the same time the lower electrode is required to be connected with one of the electrodes of a transistor formed on a semiconductor substrate.

For the purpose of avoiding counter diffusion between an underlying crystal and a lower electrode film or a ferroelectric thin film, a metallic film or an insulating film having a higher barrier property may be interposed between the underlying crystal and the lower electrode film or the ferroelectric thin film. Examples of such a metallic film are high-melting point metals such as titanium or tungsten; and silicides, nitrides or carbides of a high-melting point metal. Examples of such an insulating film are oxides, nitrides and fluorides.

There will now be described a thin film capacitor suitably employed in the semiconductor memory device according to this invention.

This thin film capacitor comprises a conductive substrate having at least on its surface a conductive material having a crystal structure belonging to either (001) plane of tetragonal system or cubic system, a dielectric film deposited on said conductive substrate through an epitaxial growth and consisting of a dielectric material having a perovskite crystal structure belonging to either tetragonal system or cubic system, and an upper electrode formed on said dielectric film. This thin film capacitor is characterized in that the Curie point inherent to said dielectric material is 150° C. or less, and that a lattice constant ad which is inherent to said dielectric material and represented by a length of a-axis of the perovskite crystal structure and a lattice constant as which is inherent to said conductive material and represented by a length of a-axis of the crystal structure belonging to either tetragonal system or cubic system satisfy the following relational expression:

$$1.002 < ad/as < 1.015$$

In the thin film capacitor according to this invention, the dielectric material is preferably selected from compounds having a perovskite composition represented by the general formula; $ABO_3$ (wherein A is at least one element selected from the group consisting of Ba, Sr and Ca; and B is at least one material selected from the group consisting of Ti, Zr, Hf, Sn, $(Mg_{1/3}Nb_{2/3})$, $(Mg_{1/3}Ta_{2/3})$, $(Zn_{1/3}Nb_{2/3})$, $(Zn_{1/3}Ta_{2/3})$, $(Mg_{1/2}Te_{1/2})$, $(Co_{1/2}W_{1/2})$, $(Mg_{1/2}W_{1/2})$, $(Mn_{1/2}W_{1/2})$, $(Sc_{1/2}Nb_{1/2})$, $(Mn_{1/2}Nb_{1/2})$, $(Sc_{1/2}Ta_{1/2})$, $(Fe_{1/2}Nb_{1/2})$, $(In_{1/2}Nb_{1/2})$, $(Fe_{1/2}Ta_{1/2})$, $(Cd_{1/3}Nb_{2/3})$, $(Co_{1/3}Nb_{2/3})$, $(Ni_{1/3}Nb_{2/3})$, $(Co_{1/3}Ta_{2/3})$ and $(Ni_{1/3}Ta_{2/3})$).

The thin film capacitor according to a modified example of this invention comprises a first electrode, a dielectric film epitaxially grown on the first electrode and consisting of a dielectric material of a perovskite crystal structure belonging to either tetragonal system or hexagonal system, and a second electrode formed on the dielectric film, wherein the film thickness of the dielectric film is 15 nm or more, and C-axis length Ce of the dielectric material after the epitaxial growth and C-axis length Co of tetragonal system or a-axis length of hexagonal system which is inherent to the dielectric material before the epitaxial growth thereof satisfy the following relational expression:

$$Ce/Co > 1.02$$

As explained above, according to this invention with the thin film capacitor suitably used in the semiconductor memory device, in order to raise the Curie point of a dielectric material to a temperature higher than the Curie point inherent to the dielectric material, and to sufficiently increase the magnitudes of residual polarization and capacity for the practical use thereof, the ratio between a lattice constant ad which is inherent to a dielectric material to be employed for a dielectric film and a lattice constant as which is inherent to a conductive material to be employed for an underlying layer is controlled to satisfy the relational expression of $1.002 < ad/as < 1.015$, that is, a dielectric film having a perovskite structure whose lattice is shrinked in a-axis and stretched in c-axis is employed and formed in a sufficient thickness.

The reason for limiting the ratio of ad/as to 1.002 or more in this invention is that if the ratio is less than 1.002, the Curie point of the dielectric film can be raised not at all or even if raised very little higher than the Curie point which is inherent to the dielectric material. On the other hand, the reason for limiting the ratio of ad/as to not more than 1.015 is that if the ratio exceeds over 1.015, the Curie point of the dielectric film cannot be sufficiently raised especially when the dielectric film is to be used with a higher film thickness of 70 nm or more, due to the misfit transition to be introduced during the epitaxial growth of the dielectric film on the conductive substrate. Further, if the ratio of ad/as is more than 1.015, the degree of increase, if any, in Curie point of a dielectric film having a relatively thin film thickness of less than 70 nm may be very little.

The ratio of ad/as should preferably be controlled within the range of 1.002 to 1.015, since, under such a condition, the misfit of lattice constant can be minimized and a dielectric film of good quality can be easily obtained through an epitaxial growth regardless of the film-forming temperature.

In the thin film capacitor described above, the conductive substrate may be arbitrary selected as long as at least the surface thereof is conductive and also the crystal structure thereof belongs to either (001) plane of tetragonal system or cubic system. Namely, there is no limitation in crystal plane in the case of cubic system. However, it is preferable to employ a crystal structure whose surface belongs to the (001) crystal plane of cubic system in View of the easiness of epitaxially growing a dielectric material thereon.

Specifically, a thin film made of a conductive compound of perovskite crystal structure, such as $(Ba_x Sr_{1-x})TiO_3$ ($0 < x < 1$) whose electric resistance is reduced by the addition of a metal such as Pt or Nb may be employed as it is.

The crystal orientation for effecting the epitaxial growth of a dielectric film formed of such a dielectric material on a conductive substrate may preferably be selected such that either (001) plane of tetragonal system or (001) plane of cubic system of the dielectric film becomes parallel with the crystal plane of the conductive substrate. The method of forming such a dielectric film may be selected from a reactive vapor deposition, an rf sputtering, a laser ablation and MOCVD. Among them, the sputtering method is most preferable especially when a thick film of over 70 nm is to be formed.

The thickness of the dielectric film should preferably be 70 nm or more in view of obtaining a sufficient residual polarization or an effective dielectric constant when the dielectric film is to be employed as a dielectric memory. More specifically, in the actual use thereof, the thickness of the dielectric film should desirably be in the range of 70 nm to 15 nm. As for the dielectric film exhibiting a paraelectricity that can be used in DRAM and etc. however, it is possible to employ a dielectric film having a thickness of less than 70 nm for the formation of a capacitor of memory cell of DRAM.

The reason why the Curie point inherent to a dielectric material is preferably not more than 150° C. in this invention is that in the case of a dielectric material whose Curie point is not so high, the effect that can be obtained by the raise of the Curie point according to this invention becomes very prominent, and at the same time the axis of polarization can be excellently aligned in the direction of thickness of the film (perpendicular direction) as the dielectric film is deposited through epitaxial growth on a conductive substrate to form a dielectric film exhibiting ferroelectricity, resulting in the formation of a dielectric film which hardly deteriorates even if it is subjected to the repeated inversion of polarization.

In the thin film capacitor described above, a dielectric film having a perovskite structure whose lattice is shrinked in a-axis and stretched in c-axis is formed as explained above. With this forced introduction of distortion of prescribed direction in the lattice by making the most of a difference in lattice constant between a dielectric film and an underlying layer, it has become possible to raise the Curie point of the dielectric film to a temperature higher than the Curie point inherent to the dielectric film. In this case, since a dielectric material having a Curie point of not more than 150° C. is generally small in crystal anisotropy, or spontaneous distortion of lattice at room temperature, the distortion forcibly introduced into the lattice can hardly be offset by the spontaneous distortion of the lattice, thus realizing a very effective forced-introduction of the distortion into the lattice.

As explained above, a thin film capacitor in which a ferroelectric thin film having a higher Curie point than the inherent Curie point thereof is formed thereby to improve the residual polarization and the temperature dependency of the residual polarization is preferably applied to the semiconductor memory device according to the present invention. However, a thin film capacitor comprising a dielectric material exhibiting paraelectricity that can be employed in DRAM can be also used. In this case, it is possible to realize a semiconductor memory device provided with a thin film capacitor having a large capacity and excellent in temperature dependency of the capacity by raising the Curie point higher than the inherent Curie point of the dielectric material.

Further, PZT, which is a conventional ferroelectric material, can be used as a dielectric material. In this case, the dielectric film and the lower electrode are converted into singlecrystal to decrease mutual diffusion, thereby improving fatigue property and the memory holding property. Thus, the present invention provides large merits.

According to this invention, it is possible through the use of a dielectric film epitaxially grown, to induce an increase in accumulated electric charge and a ferroelectricity, and at the same time to minimize the non-uniformity in capacity of the capacitor among the memory cells, thereby making it possible to manufacture a highly integrated semiconductor memory device, thus making it very valuable from an industrial view point.

EXAMPLE 1

FIG. 1 shows a sectional view of a dynamic access memory (DRAM) of Example 1 of this invention. In this FIG. 1, the reference numeral 41 represents a first conductivity type semiconductor substrate; 42, an isolation oxide film; 43, a gate oxide; 44, a word line; 45 and 47, an interlayer insulating film; 46, a second conductivity type impurity diffusion region; 48, a bit line; 49, a flattening insulating film; 50, an abrasion-terminating layer; 51, a singlecrystalline silicon contact plug; 52, an epitaxial barrier metal; 53, an epitaxial lower electrode; 54, an epitaxial dielectric film; and 55, an upper electrode.

Figure 2A:
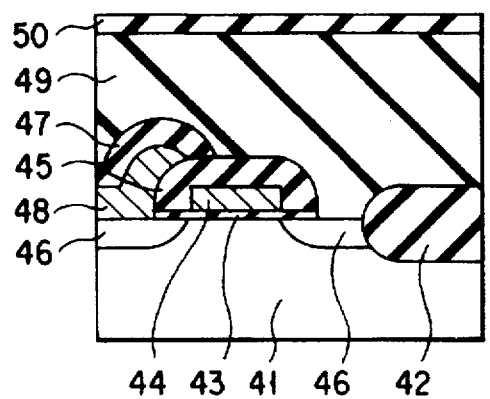
FIGS. 2A to 2F show sectional views showing the steps of manufacturing the DRAM of Example 1.

FIGS. 2A to 2F show sectional views showing the steps of manufacturing the DRAM of Example 1. FIG. 2A depicts a sectional view obtained after a process that the transistor of memory cell and bit line 48 are formed on a substrate, and then the flattening insulating film 49 and the abrasion-terminating layer 50 are formed. In this case, an etch-back method or the CMP method may be employed for flattening the insulating film. As for the abrasion-terminating layer 50, an insulating film such as aluminum oxide may be employed.

Figure 2D:
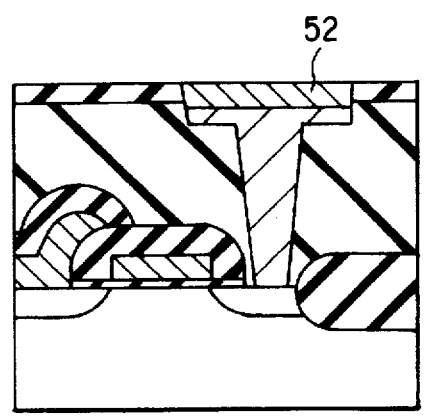
Figure 2B:
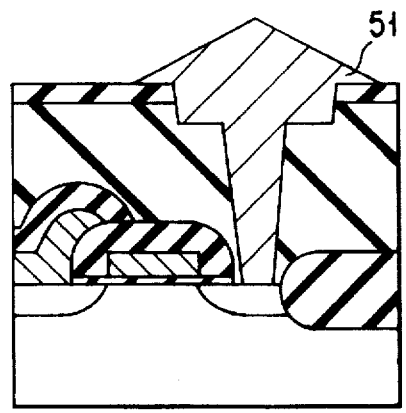

Then, as shown in FIG. 2B, a contact hole extending to the impurity diffusion region 46 was formed in the opening of the abrasion-terminating layer 50 by means of the conventional lithography and plasma etching method. Subsequently, the contact plug 51 was formed by way of a singlecrystalline silicon-selective growth technique. The contact plug 51 was formed by selectively growing a singlecrystalline silicon in the opening in a growth temperature of 820° C. by means of LPCVD method using dichlorosilane as a raw material gas.

Figure 2E:
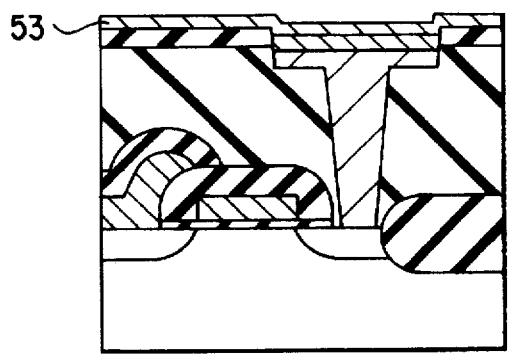
Figure 2C:
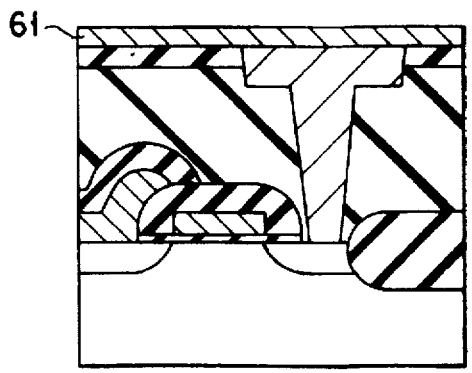
Figure 2F:
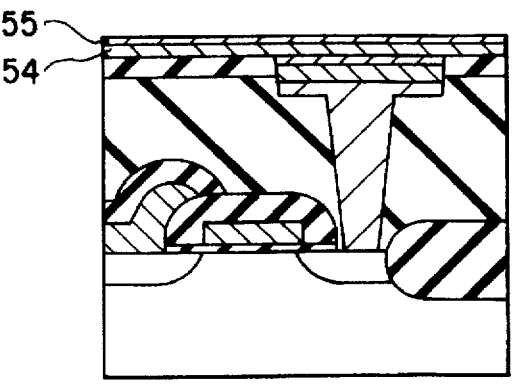

Then, as shown in FIG. 2C, the singlecrystalline silicon formed on the abrasion-terminating layer 50 was removed by way of the CMP or mechanical abrasion, and then a nickel thin film 61 was formed by means of sputtering. Subsequently, as shown in FIG. 2D, the surface of the singlecrystalline silicon was caused to react with nickel by thermally treating the singlecrystalline silicon in a forming gas at a temperature of 500° C., thereby forming a singlecrystalline nickel silicide layer to be functioned as a barrier metal. Then, the CMP method was again employed to remove a nickel layer formed on the abrasion-terminating layer 50, thereby forming the epitaxial barrier metal 52.

Then, as shown in FIG. 2E, after a shallow trench was formed in the nickel silicide layer by means of the lithography and plasma etching method, a Pt thin film to be functioned as the lower electrode 53 was formed by sputtering. Then, the CMP method was again employed to remove the Pt thin film formed on the abrasion-terminating layer 50. Thereafter, the $SrTiO_3$ epitaxial dielectric film 54 and the upper electrode 55 were successively formed. The formation of this dielectric film may be performed by using the conventional magnetron sputtering method or the MOCVD method.

When the $SrTiO_3$ epitaxial dielectric film 54 thus formed was subjected to an X-ray diffraction analysis according to the θ-2θ method, only the peak of (100) plane or the peak of those corresponding to a multiple thereof was recognized, and any peak corresponding to (110), (211) or (111) was not admitted.

EXAMPLE 2

Figure 3:
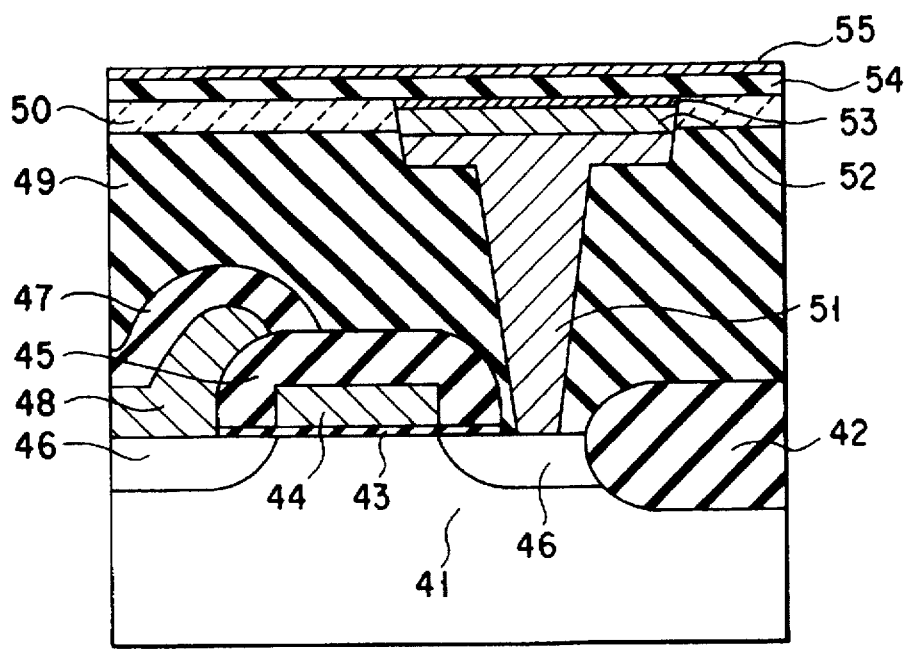
FIG. 3 is a sectional view showing a ferroelectric memory according to Example 2.

The semiconductor memory device shown in FIG. 3 is almost the same as that of Example 1 except that a ferroelectric film whose ferroelectricity is induced by the distortion resulting from the non-matching distortion to be developed at the time of epitaxial growth is used instead of using a dielectric film exhibiting ferroelectricity for the formation of a ferroelectric memory (FRAM).

In this FIG. 3, the reference numeral 41 represents a first conductivity type semiconductor substrate; 42, an isolation oxide film; 43, a gate oxide; 44, a word line; 45 and 47, an interlayer insulating film; 46, a second conductivity type impurity diffusion region; 48, a bit line; 49, a flattening insulating film; 50, an abrasion-terminating layer; 51, a singlecrystalline silicon contact plug; 52, an epitaxial barrier metal; 53, an epitaxial lower electrode; 56, an epitaxial dielectric film; and 55, an upper electrode.

FIGS. 4A to 4F show sectional views showing the steps of manufacturing the DRAM of Example 2. The manufacturing steps shown in FIGS. 4A and 4B were performed in almost the same manner as in Example 1, i.e. the transistor of memory cell, bit line, the flattening insulating film 49 and the abrasion-terminating layer 50 were formed, and then after forming a contact hole extending to the interlayer insulating film 46, the contact plug 51 was selectively formed by way of a singlecrystalline silicon-selective growth technique in the opening.

Figure 4A:
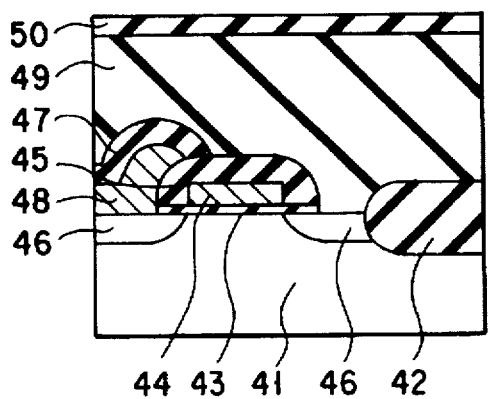
FIGS. 4A to 4F show sectional views showing the steps of manufacturing a ferroelectric memory according to Example 2.
Figure 4D:
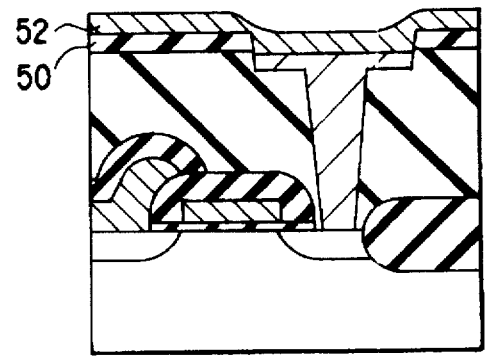
Figure 4B:
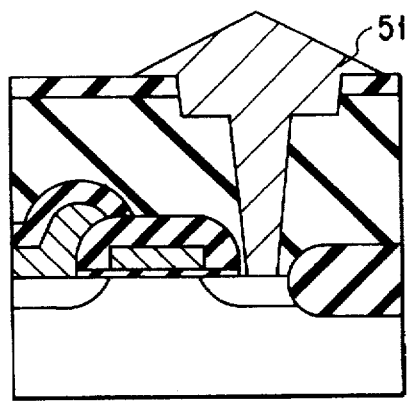
Figure 4E:
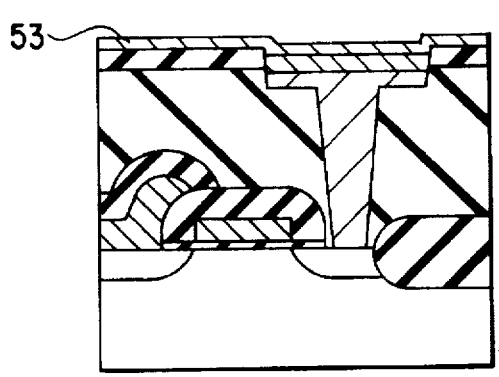
Figure 4C:
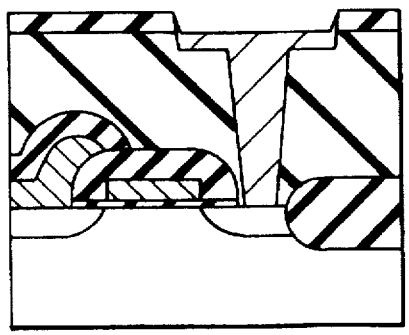

Then, as shown in FIG. 4C, the singlecrystalline silicon formed on the abrasion-terminating layer 50 was removed by way of the CMP or mechanical abrasion and then a shallow trench was formed by means of photolithography and ion-etching. Subsequently, as shown in FIG. 4D, TiN was epitaxially grown by means of a reactive sputtering method at a temperature of 600° C., thus forming the epitaxial barrier metal 52. The TiN which was formed on the surface of the abrasion-terminating layer 50 was removed through abrasion.

Figure 4F:
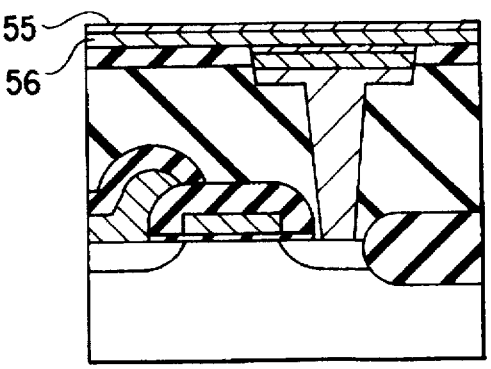

Then, as shown in FIG. 4E, after a shallow trench was formed in the TiN layer by means of the lithography and plasma etching method, a Pt thin film to be functioned as the lower electrode 53 was formed by sputtering. Then, the CMP method was again employed to remove the Pt thin film formed on the abrasion-terminating layer 50 as shown in FIG. 4F. Thereafter, the $Ba_{0.5}Sr_{0.5}TiO_3$ epitaxial dielectric film 56 was epitaxially grown to give a ferroelectricity to the dielectric film 56, the ferroelectricity being induced by a distortion due to the non-matching between the dielectric film 56 and Pt. Subsequently, the nickel upper electrode 55 was successively formed.

When the epitaxial film thus formed was subjected to an X-ray diffraction analysis according to the θ-2θ method, only the peak of (200) plane and the peak of those corresponding to a multiple thereof were recognized with regard to TiN and Pt, and only the peak of (100) plane and the peak of those corresponding to a multiple thereof were recognized with regard to BSTO, failing to recognize any peak corresponding to (110), (211) or (111). When the rocking curve of the (200) diffraction line of each film was measured, the half-value breadth of 0.8°, 0.3° and 0.5° were obtained with regard to TiN, Pt and BSTO, respectively, and the formation of a film having a very clearly oriented (100) plane was recognized.

Furthermore, when the epitaxial film thus formed was measured of its P-E curve by means of Soryer-Tower circuit, a hysteresis loop indicating a ferroelectricity was observed, and when the temperature dependency of the relative dielectric constant was measured up to a temperature of 150° C., the increase of the relative dielectric constant was recognized over the range from room temperature to 150° C. with the Curie point thereof being increased up to 150° C. or more.

Figure 5:
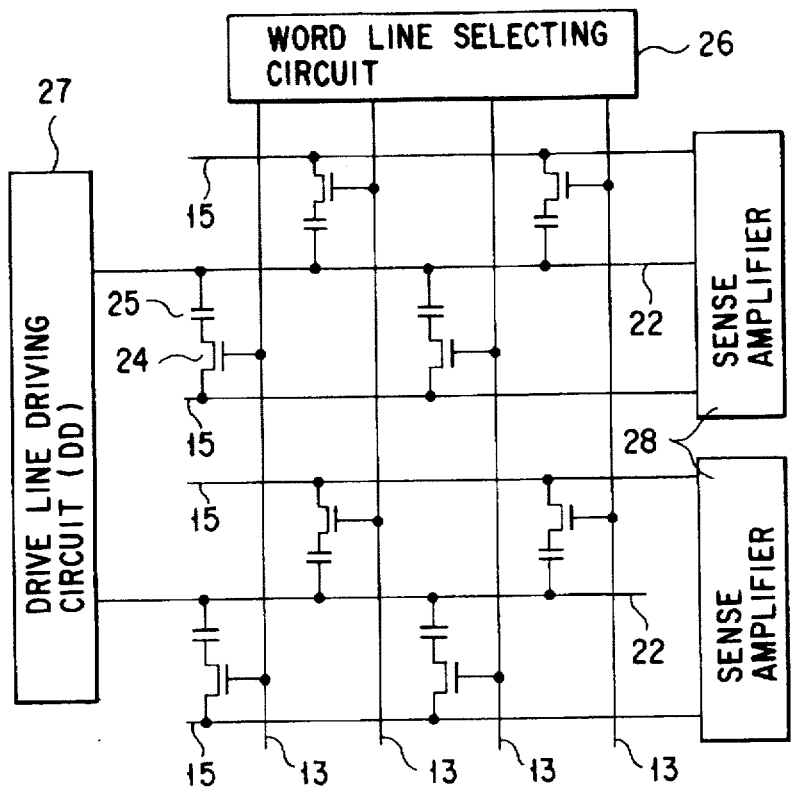
FIG. 5 is an equivalent circuit diagram of semiconductor memory device according to Example 2.

FIG. 5 shows an equivalent circuit diagram of the semiconductor memory device described above. As shown in FIG. 5, a memory cell of 1 bit comprises one switching transistor 24 and one thin film capacitor 25, and is arranged in a matrix pattern. The gate electrode of the switching transistor 24 is connected with a word line 13, and one region selected from the source region 14-1 and the drain region 14-2 is connected with a bit line 15.

A pair of electrodes of the thin film capacitor 25 are connected respectively with the other region selected from the source region 14-1 and the drain region 14-2 of the switching transistor 24, and with a drive line 22. The word line 13 and the drive line 22 are crossed to each other, and connected respectively with a word line selecting circuit 26 and a drive line driving circuit 27. With a pair of bit lines 15, a bit line pair is formed and disposed on both sides of one drive line 22, and at the same time connected with a sense amplifier 28.

When a writing is to be performed in this semiconductor memory device, the word line 13 of prescribed row address is selected through the word selecting circuit 26, the word line 13 thus selected is activated to turn the switching transistor 24 connected therewith into ON state, and then an electric potential corresponding to the information of "1" or "0" is given to the bit line 15 in relative to the prescribed column address and at the same time the drive line 22 is activated by the drive line driving circuit 27 to transmit a writing signal.

Then, the activation of the word line 13 is terminated and the switching transistor 24 is turned back to OFF state. As a result, an information of "1" or "0" is accumulated and stored in the thin film capacitor 25 within the memory cell that can be selected by the product of the row address and column address as mentioned above, thereby performing a writing.

The information thus written would not vanish even if one of the word line 13 and the drive line 22 which are connected with the switching transistor 24 and the thin film capacitor 25 of a memory cell storing the written information is subsequently activated.

When a readout is to be performed in this semiconductor memory device, the word line 13 of prescribed row address is selected through the word selecting circuit 26, the word line 13 thus selected is activated to turn the switching transistor 24 connected therewith into ON state, and then the bit line pair is precharged in relative to a prescribed column address thereby turning it into a floating condition. Then, the drive line 22 is activated by the drive line driving circuit 27 to give a prescribed electric potential to the drive line.

The information accumulated and stored in the thin film capacitor 25 of the memory cell that can be selected by the product of the row address and column address as mentioned above is taken out by one of the bit line 15 out of the bit line pair precharged through the switching transistor 24, and a minute potential difference corresponding to the information taken out is generated between the bit line pair. Therefore, it is possible to perform a readout of the information accumulated and stored in the thin film capacitor 25 of the memory cell by amplifying this potential difference by the sense amplifier 28.

It is possible to perform a rewriting of the same information as that before the readout is performed by a prescribed operation to the thin film capacitor 25 in a memory cell.

Figure 6:
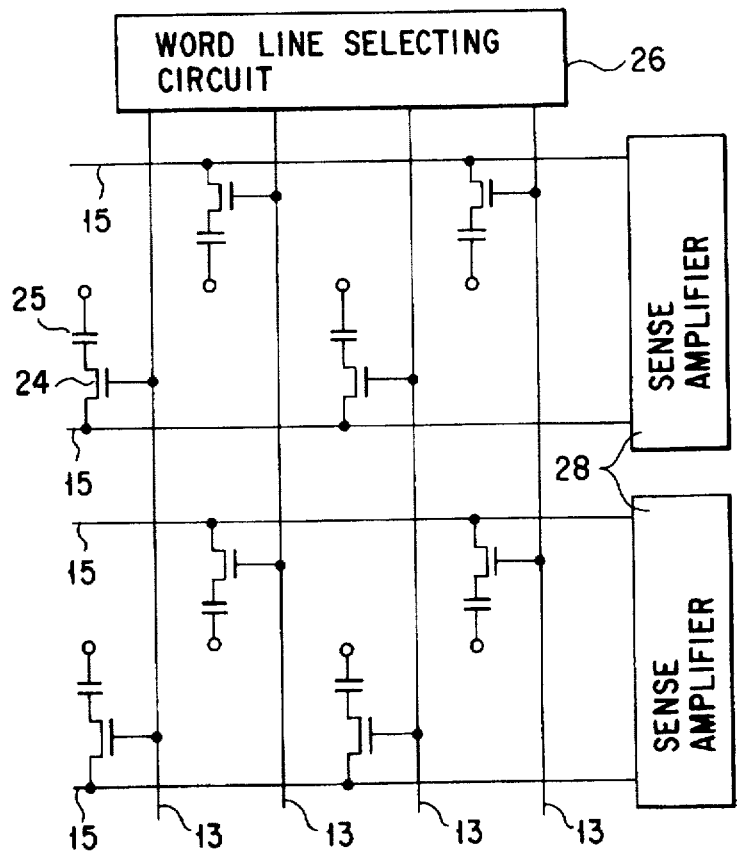
FIG. 6 is an equivalent circuit diagram of another semiconductor memory device of this invention.

FIG. 6 shows an equivalent circuit diagram of another semiconductor memory device of this invention. As shown in FIG. 6, the thin film capacitor 25 employed herein is constructed such that a pair of electrodes are all set to a prescribed electric potential. Therefore, the semiconductor memory device of FIG. 6 can be constructed in the same manner as the memory device described above except that the lower electrode of the thin film capacitor 25 is formed throughout the surface, i.e. the lower electrode of the thin film capacitor 25 is made common to all of the memory cells.

EXAMPLE 3

Figure 7:
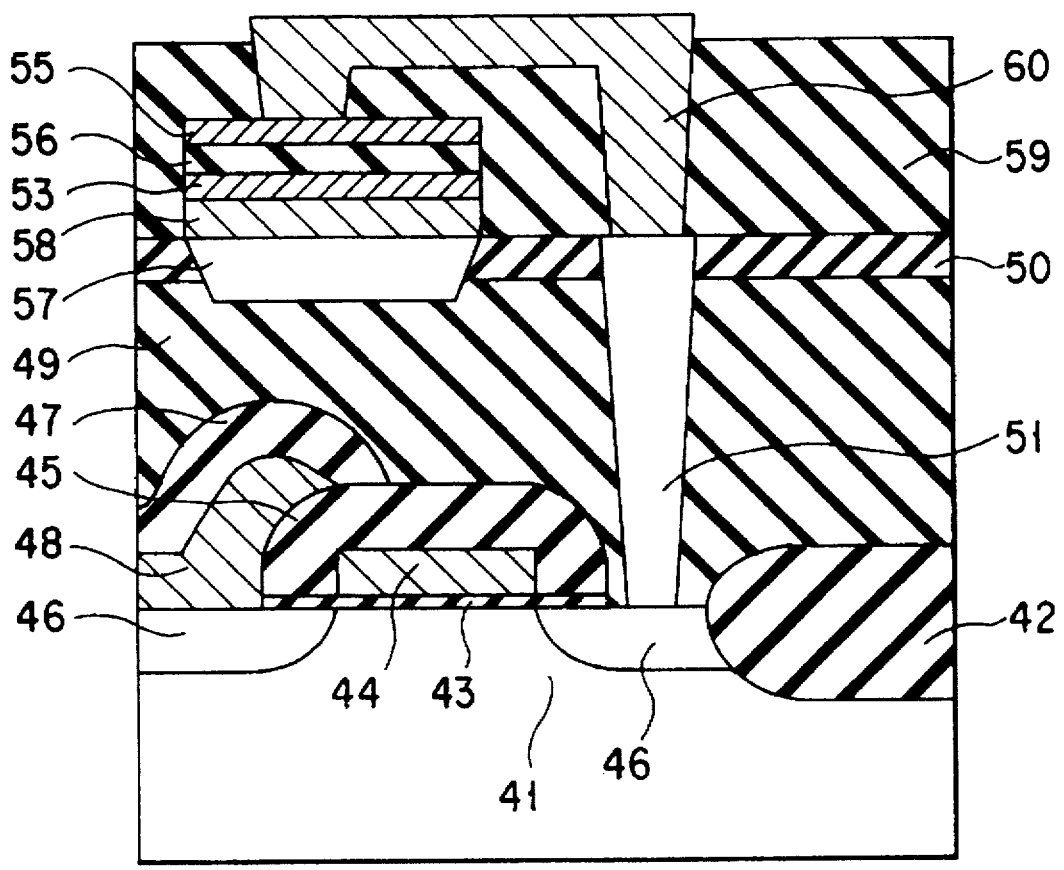
FIG. 7 is a sectional view showing a ferroelectric memory according to Example 3.

FIG. 7 shows a sectional view of a ferroelectric memory (FRAM) of Example 3 of this invention. In this FIG. 7, the reference numeral 41 represents a first conductivity type semiconductor substrate; 42, an isolation oxide film; 43, a gate oxide; 44, a word line; 45 and 47, an interlayer insulating film; 46, a second conductivity type impurity diffusion region; 48, a bit line; 49, a flattening insulating film; 50, an abrasion-terminating layer; 51, a singlecrystalline silicon contact plug; 52, an epitaxial barrier metal; 53, an epitaxial lower electrode; 55, an upper electrode; 56, an epitaxial dielectric film; 57, a singlecrystalline silicon layer; 58, an epitaxial barrier film formed of calcium fluoride; and 60, an aluminum interconnecting wiring.

Figure 8A:
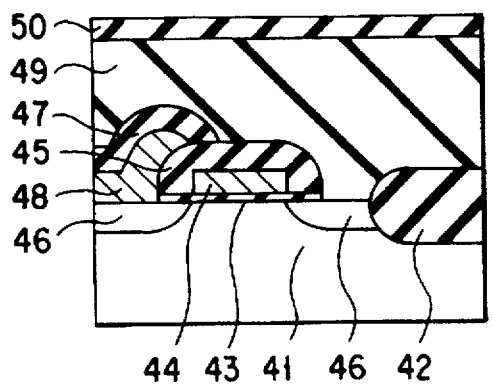
FIGS. 8A to 8F show sectional views showing the steps of manufacturing a ferroelectric memory according to Example 3.

FIGS. 8A to 8F show sectional views showing the steps of manufacturing the FRAM of Example 3. FIG. 8A depicts a sectional view of the device obtained after a process that the transistor of memory cell and bit line are formed on a substrate, and then the flattening insulating film 49 and the abrasion-terminating layer 50 are formed. In this case, an etch-back method or the CMP method may be employed for flattening the insulating film. As for the abrasion-terminating layer 50, an insulating film such as aluminum oxide may be employed.

Figure 8D:
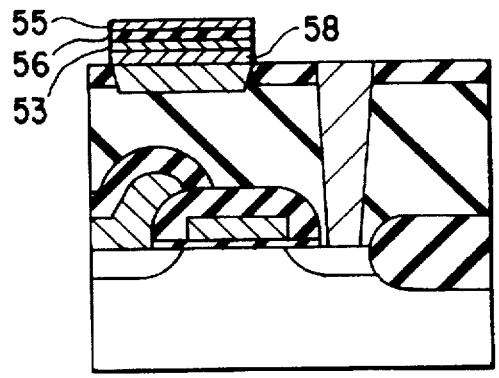
Figure 8B:
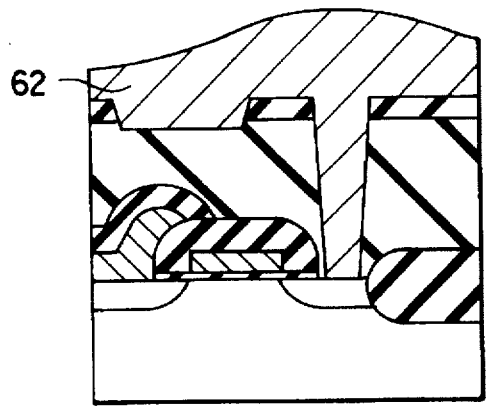

Then, as shown in FIG. 8B, a shallow trench for forming a capacitor cell and a contact hole extending to the interlayer insulating film 46 were formed by means of the conventional lithography and plasma etching method. Subsequently, an amorphous silicon layer 62 was formed by means of a selective growth technique, i.e. by using the LPCVD method employing disilane and diborane as raw material gas, an amorphous silicon was selectively grown on a singlecrystalline silicon substrate at a temperature of 450° C. Subsequently, the amorphous silicon was subjected to a heat treatment at a temperature of 600° C. in a forming gas, thereby a singlecrystalline silicon was allowed to grow through a solid growth from the interface of the silicon substrate, thus converting all of the amorphous silicon into a singlecrystal.

Figure 8E:
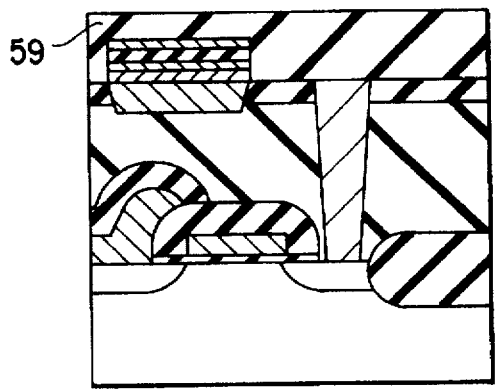
Figure 8C:
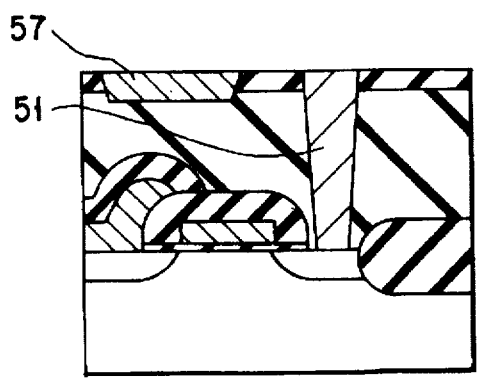

Then, as shown in FIG. 8C, the singlecrystalline silicon formed on the abrasion-terminating layer 50 was removed by way of the CMP or mechanical abrasion, and then the singlecrystalline silicon contact plug 51 and the singlecrystalline silicon film 58 were formed. Subsequently, as shown in FIG. 8D, the calcium fluoride film 58 to be functioned as a barrier and a Pt film functioning as the lower electrode 53 were epitaxially grown by means of sputtering while heating the substrate. Then, an amorphous film of PbTiO$_3$ as a ferroelectric material was formed at room temperature by the sputtering method, and then lamp-heated for one minute at a temperature of 700° C. thereby turning it into an epitaxial dielectric film 56 through a solid-phase growth. Subsequently, the upper electrode 55 was formed and then worked into the shape of a capacitor cell by means of the conventional photolithography and plasma etching.

Figure 8F:
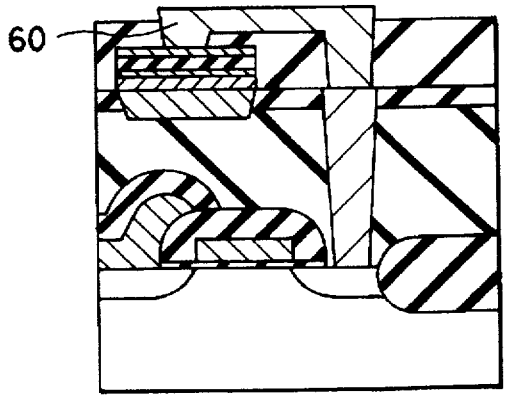

Then, as shown in FIG. 8E, the flattening insulating film 59 was formed and the surface thereof was flattened by way of the CMP or the etch-back method. Thereafter, a contact hole for communicating the singlecrystalline contact plug 51 and the upper electrode 55 of the capacitor was formed by way of photolithography and plasma etching, and then the aluminum interconnecting wiring 60 was formed therein as shown in FIG. 8F.

When this epitaxial film thus formed was subjected to an X-ray diffraction analysis according to the θ-2θ method, only the peak of (100) plane or the peak of those corresponding to a multiple thereof was recognized, and any peak corresponding to (110), (211) or (111) was not observed.

EXAMPLE 4

FIGS. 9A to 9E show sectional views showing the steps of manufacturing the semiconductor memory device of Example 4. This Example shows an embodiment of manufacturing a ferroelectric memory (FRAM) through the use of a lower electrode film strongly oriented in (111) plane.

Figure 9A:
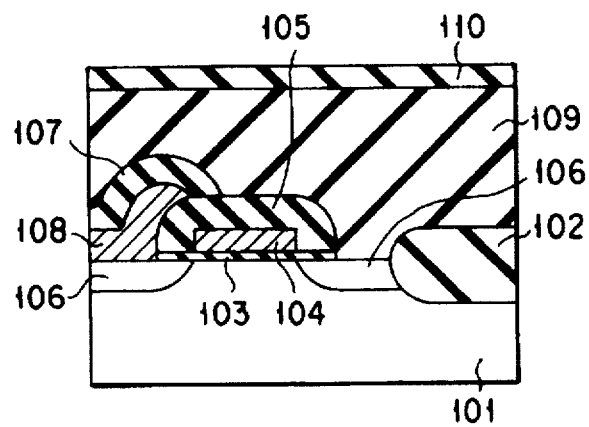
FIGS. 9A to 9E show sectional views showing the steps of manufacturing a memory cell according to Example 4.

FIG. 9A depicts a state of the device obtained after a process wherein a first conductive (for example p-type) silicon substrate 101 is used; an isolation oxide film 102, a second conductivity type (for example n-type) impurity diffusion region 106, a gate oxide film 103, a gate electrode (a word line) 104, a transistor of memory cell which comprises a first interlayer insulating film 105, a bit line 108 and a second interlayer insulating film 107 are formed on the first conductive silicon substrate 101; and then a flattening insulating film 109 and an abrasion-terminating layer 110 are formed.

In this case, an etch-back method or the CMP method may be employed for flattening the insulating film. As for the abrasion-terminating layer 110, an insulating film such as aluminum oxide may be employed.

Figure 9D:
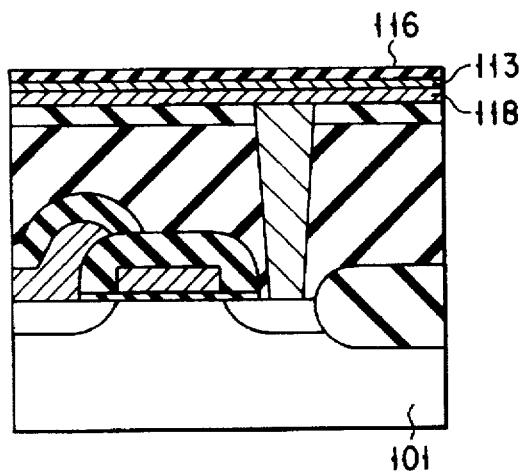
Figure 9B:
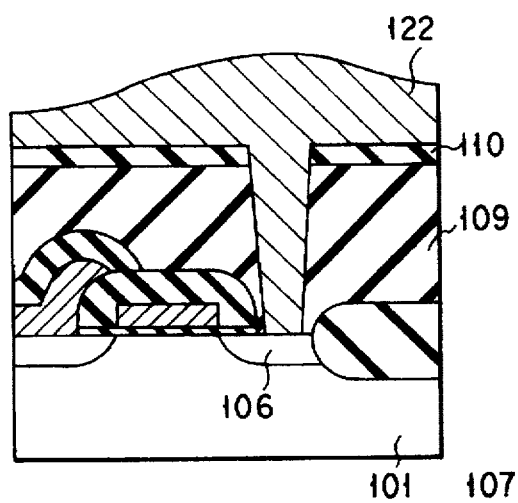

Then, as shown in FIG. 9B, a contact hole extending to the second conductivity type impurity diffusion region 106 was formed in the insulating film 109 by means of the conventional lithography and plasma etching method. Subsequently, a polysilicon layer 122 was formed by means of a selective growth technique, i.e. by using the LPCVD method employing disilane and diborane as raw material gas, and the polysilicon layer 122 was selectively grown on the silicon substrate 101 at a temperature of 700° C. Subsequently, the polysilicon layer 122 formed on the abrasion-terminating layer 110 was removed by way of the CMP or mechanical abrasion, thereby forming a polysilicon contact plug 111 as shown in FIG. 9C.

Subsequently, as shown in FIG. 9D, a titanium/titanium nitride layer 118 to function as a barrier and a Pt film 113 to function as the lower electrode were grown by means of sputtering while heating the substrate at a temperature of 700° C. When the orientation of this Pt film thus formed was subjected to an X-ray diffraction analysis, only the peak of (111) plane was recognized, indicating the formation of a film which was strongly oriented to (111) plane, or a crystal habit plane of face centered lattice.

Further, the particle diameter of this Pt film was evaluated by the observation using a transmission electron microscope, finding the particle diameter as being about 300 nm.

Then, barium strontium titanate film (BST, barium content 70%) 116, which is a perovskite dielectric film, was formed by way of sputtering at a temperature of 700° C. When the orientation of this BST film 116 was evaluated by way of an X-ray diffraction analysis, only the peak of (111) plane was recognized, and at the same time the stretching of a space between the (111) planes by 4% as calculated on the basis of the space between the planes of the singlecrystal of bulk material was recognized. When the section of the film was observed using a transmission electron microscope, the plane of BST film 116 was found as being well matched with each of the underlying surfaces of the lower electrode crystal grains of Pt, and the epitaxial growth of the BST film 116 on each of the underlying crystals was recognized.

Figure 9E:
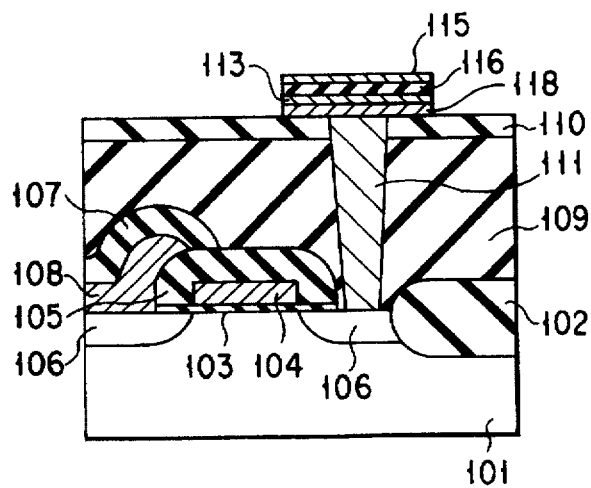
Figure 9C:
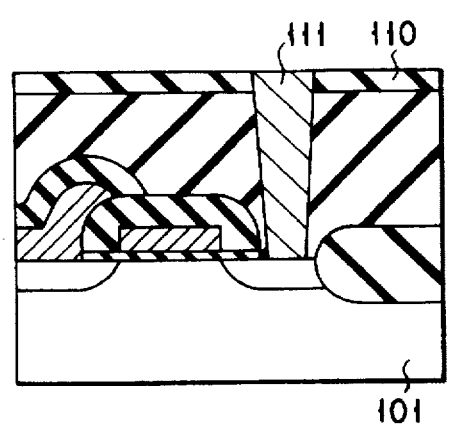

Subsequently, the upper electrode 115 was formed as shown in FIG. 9E, and then the upper electrode 115 was worked by means of photolithography and plasma etching. Subsequent steps for forming a wiring were performed using the conventional methods.

When the dielectric properties of the capacitor thus obtained were evaluated, the following features were admitted. Namely, a variation in the accumulated charge depending on the direction of the polarization resulting from definite ferroelectricity was observed. Further, in view of the temperature dependency of dielectric constant, the Curie point thereof was assumed as being 200° C. or more. Namely, a Pt film 113 having an orientation in the direction of (111) plane was grown on the abrasion-terminating layer 110 functioning as an insulating film, so that the dielectric properties of BST film 116 to be deposited on the Pt film 113 and to function as a ferroelectric film of a charge-accumulating capacitor were extremely improved, thus making it possible to enhance the integration of the memory cells.

EXAMPLE 5

Figure 10A:
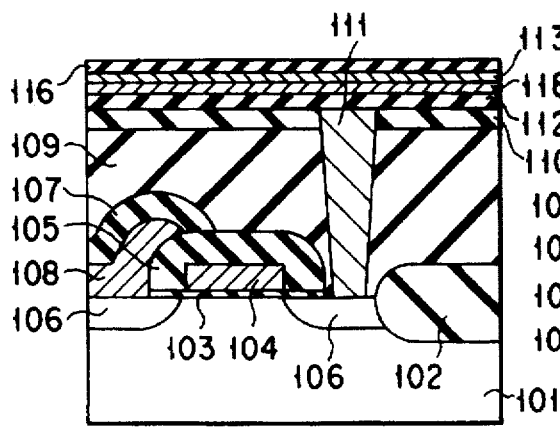
FIGS. 10A to 10C show sectional views showing the latter half of the manufacturing steps of a memory cell according to Example 5.
Figure 10B:
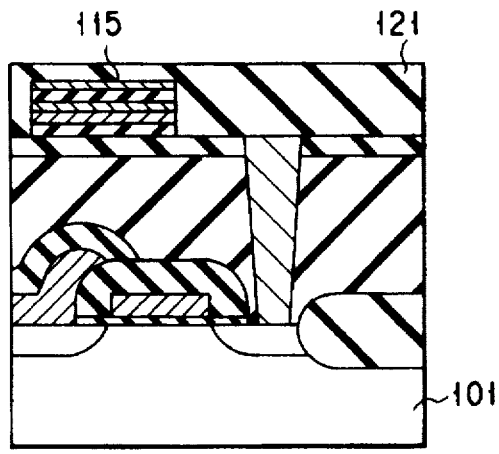
Figure 10C:
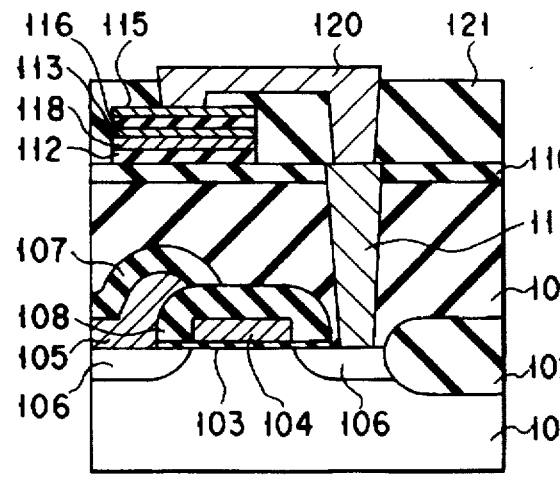

FIGS. 10A to 10C show sectional views showing the steps of manufacturing the semiconductor memory device of Example 5. This Example shows an embodiment of manufacturing a ferroelectric memory (FRAM) through the use of an insulative underlying crystal strongly oriented in (100) plane.

Steps up to forming the polysilicon contact plug 111 are the same as those explained with reference to FIGS. 9A to FIG. 9C in Example 4, so that the explanation thereof is omitted herein.

As shown in FIG. 10A, a MgO crystal film 112 having a thickness of 500 nm was deposited on the substrate at a substrate temperature of 600° C. by using magnesium acetylacetate as a raw material and employing a CVD method. Subsequently, the abrasion was performed so as to flatten the surface of the MgO crystal film, and then the surface of the MgO crystal film was slightly etched to expose the (100) plane. Subsequently, a titanium nitride layer 118 to be functioned as a barrier was grown by means of a reactive sputtering while heating the substrate at a temperature of 600° C., then a Pt film 113 to be functioned as the lower electrode were grown by means of sputtering while heating the substrate at a temperature of 700° C., and finally BST film (barium content: 70%) 116, which is a perovskite dielectric film, was formed by means of sputtering.

When the orientation of each film thus formed was subjected to an X-ray diffraction analysis, only a superimposed peak of MgO and TiN, as well as a peak of (100) plane (with respect to Pt and BST) were recognized, indicating the formation of a film which was strongly oriented to (100) plane.

Further, the stretching of a space between the BST (100) planes by 3% as calculated on the basis of the space between the planes of the singlecrystal of bulk material was recognized. When the section of the film was observed using a transmission electron microscope, the orientations of the MgO underlying crystal, TiN crystal, Pt crystal and BST crystal were found as being well matched with each other.

Thereafter, as shown in FIG. 10B, the upper electrode 115 was formed and then worked by means of the conventional photolithography and plasma etching to form a capacitor cell. Then, the insulating film 121 was formed on the upper electrode 115. As shown in FIG. 10C, a contact hole for communicating the polycrystalline contact plug 111 and the upper electrode 115 of the capacitor was formed in the insulating film 121 by way of photolithography and plasma etching, and then the aluminum interconnecting wiring 120 was formed.

When the dielectric properties of the capacitor thus obtained was evaluated, the following features were admitted. Namely, a variation in the accumulated charge depending on the direction of the polarization resulting from definite ferroelectricity was observed. Further, in view of the temperature dependency of dielectric constant, the Curie point thereof was assumed as being 200° C. or more.

EXAMPLE 6

Figure 11A:
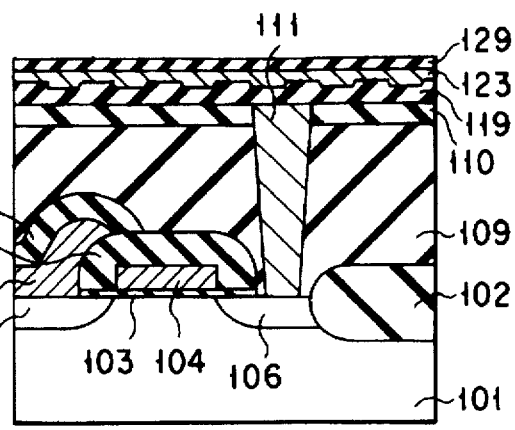
FIGS. 11A to 11C show sectional views showing the manufacturing steps of a memory cell according to Example 6.
Figure 11B:
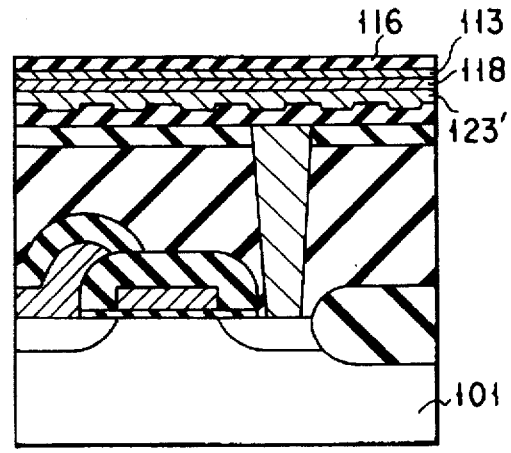
Figure 11C:
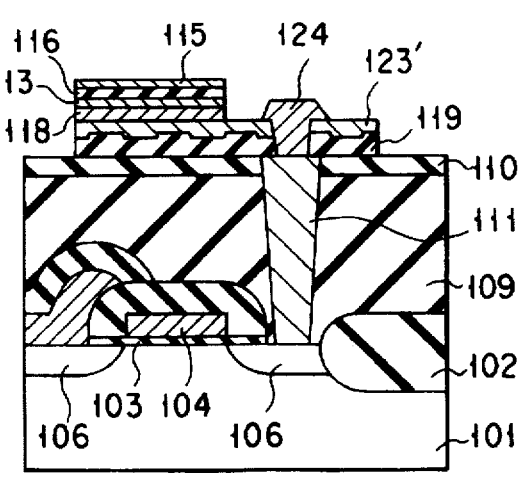

FIGS. 11A to 11C show sectional views showing the steps of manufacturing the semiconductor memory device of Example 6. This Example shows an embodiment wherein a (100) singlecrystalline layer was formed on an amorphous underlying layer by using a graphoepitaxy technique, and then a charge-accumulating capacity cell was formed thereon.

Steps up to forming the polysilicon contact plug 111 are the same as those explained with reference to FIG. 9A to FIG. 9C in Example 4, so that the explanation thereof is omitted herein.

As shown in FIG. 11A, an amorphous silicon oxide layer 119 was deposited on the substrate by a plasma CVD method, and trenches 20 nm in depth were formed at an interval of 0.25 μm by way of the conventional lithography and plasma etching method. Subsequently, an amorphous silicon layer 123, 100 nm in thickness was deposited using a plasma CVD method, and then a silicon oxide layer 129, 100 nm in thickness was deposited using a plasma CVD method. Subsequently, the scanning of argon laser at a velocity of 10 mm/s was performed so as to recrystalize the silicon layer and the silicon oxide layer.

When these films thus treated were subjected to an X-ray diffraction analysis with respect to the crystal orientation, the growth of singlecrystalline Si layer whose (100) plane was excellently oriented in the direction of surface and the trench was confirmed.

Then, the silicon oxide layer 129 was removed with hydrofluoric acid, and a titanium nitride layer to function as a barrier was deposited on the singlecrystalline silicon layer 123 at a substrate temperature of 600° C. by using a reactive sputtering method. Then, a Pt film 113 to function as the lower electrode were grown by means of sputtering while heating the substrate at a temperature of 600° C., and finally BST film (barium content: 80%) 116, which is a perovskite dielectric film, was formed by means of sputtering while heating the substrate at a temperature of 600° C.

When the orientation of each film thus formed was subjected to an X-ray diffraction analysis, only a superimposed peak of MgO and TiN, as well as a peak of (100) plane (with respect to Pt and BST) were recognized, and at the same time, 4 times-symmetrical (101) plane with respect to the in-plane rotation was recognized, thus indicating the formation of a film which was strongly oriented to (100) plane.

Further, the stretching of a space between the BST (100) planes by 4% as calculated on the basis of the space between the planes of the singlecrystal of bulk material was recognized.

Thereafter, as shown in FIG. 11C, the upper electrode 115 was formed and then worked by means of the conventional photolithography and plasma etching to form a capacitor cell. Then, in order to form an electrical connection between the polysilicon contact plug 111 and the singlecrystalline silicon layer 123', a polysilicon film 124 was formed. The steps thereafter were performed by the conventional methods.

When the dielectric properties of the capacitor thus obtained was evaluated, the following features were admitted. Namely, a variation in the accumulated charge depending on the direction of the polarization resulting from definite ferroelectricity was observed. Further, in view of the temperature dependency of dielectric constant, the Curie point thereof was assumed as being 300° C. or more.

EXAMPLE 7

FIGS. 12A to 12E show sectional views showing the steps of manufacturing the semiconductor memory device of Example 7. This Example shows an embodiment wherein an underlying crystal grown from a single or a plurality of nuclei was employed to manufacture a ferroelectric memory (FRAM).

Steps up to forming the abrasion-terminating layer 110 are the same as those explained with reference to FIG. 9A in Example 4, so that the explanation thereof is omitted herein.

Figure 12A:
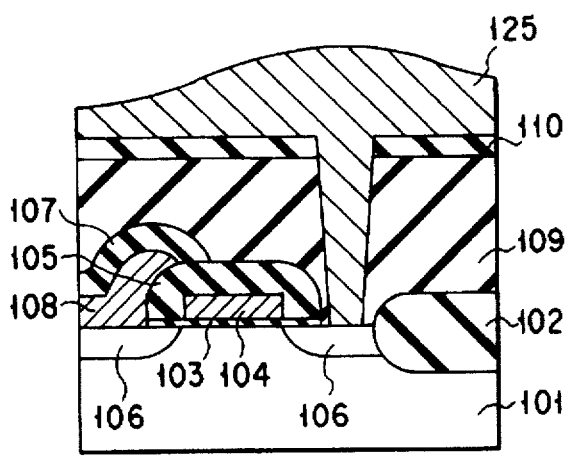
FIGS. 12A to 12E show sectional views showing the steps of manufacturing a memory cell according to Example 7.

As shown in FIG. 12A, a contact hole extending to the second conductivity type impurity diffusion region 106 was formed in the insulating film 109 by means of the conventional lithography and plasma etching method. Subsequently, an amorphous silicon layer 125 was formed. The growth of the silicon layer 125 was performed at a temperature of 450° C. by using the LPCVD method employing disilane and diborane as raw material gas.

Figure 12D:
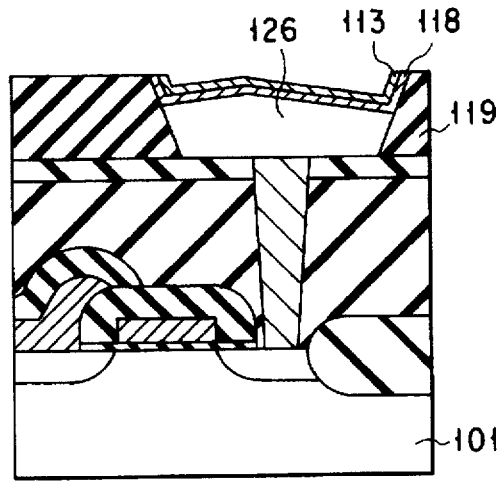
Figure 12B:
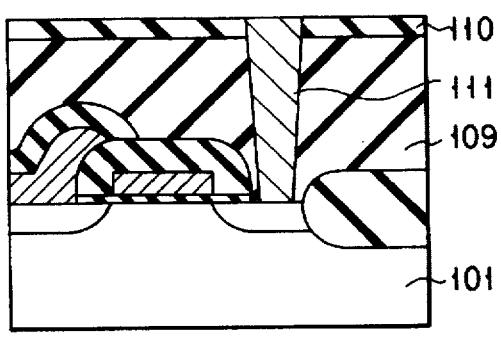

Subsequently, the amorphous silicon layer 125 formed on the abrasion-terminating layer 110 was removed by way of the CMP or mechanical abrasion, and then heat treated at a temperature of 650° C. thereby crystallizing the layer and forming a polysilicon contact plug 111 as shown in FIG. 12B. In this case, if the crystal of Si is sufficiently larger as compared with the diameter of the plug 111, the exposed surface can be made into a single crystal.

Figure 12E:
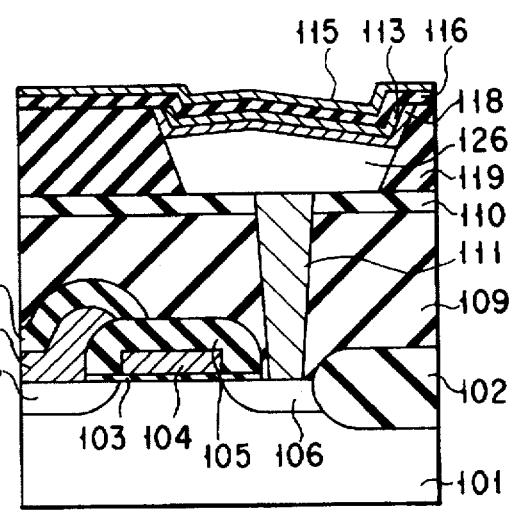
Figure 12C:
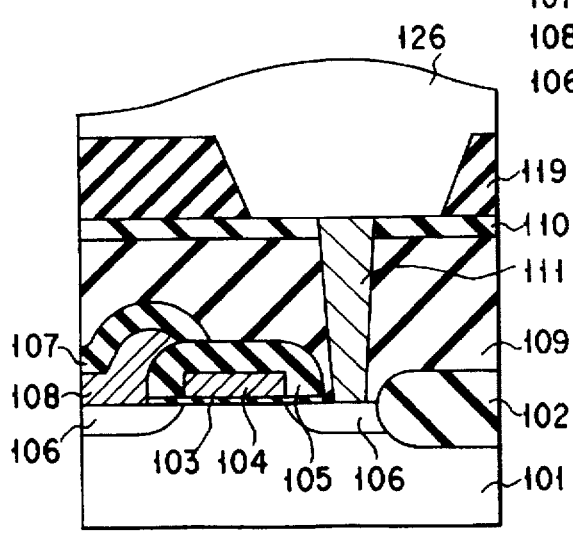

Subsequently, as shown in FIG. 12C, after an interlayer insulating film 119 was formed, a portion of the insulating film 119 was opened to expose the plug 111 by means of lithography and plasma etching method. Further, an amorphous silicon layer was grown using the CVD method, which was then heat treated at a temperature of 600° C., thereby allowing a solid phase growth from a contacting portion thereof with the crystallized contact plug 111, whereby a silicon film 126 which was partially monocrystallized at the portion near the plug was obtained.

Then, as shown in FIG. 12D, the surface was flattened by way of CMP and etched using anisotropic etching solution, i.e. a tetramethyl ammonium hydroxide solution, thereby forming a crystal habit surface of Si crystal, i.e. (111) plane. Further, a titanium nitride layer 118 to function as a barrier was deposited on the silicon layer at a substrate temperature of 600° C. by using a reactive sputtering method, and then, a Pt film 113 to be functioned as the lower electrode were grown by means of sputtering while heating the substrate at a temperature of 600° C. Subsequently, the resultant surface was flattened by means of MP or mechanical polishing, leaving the lower electrode at only a capacitor-forming region.

Then, as shown in FIG. 12E, a BST film (barium content: 90%) 116, which is a perovskite dielectric film, was formed by way of sputtering at a temperature of 600° C., thereby forming an upper electrode 115. When the section of the film was observed using a transmission electron microscope, the orientations of the Si underlying crystal, TiN crystal, Pt crystal and BST crystal thus laminated were found as being well matched with each other, and epitaxially grown on each crystal habit surface portion of the underlying crystal grain.

When the dielectric properties of the capacitor thus obtained were evaluated, the following features were admitted. Namely, a variation in the accumulated charge depending on the direction of the polarization resulting from definite ferroelectricity was observed. Further, in view of the temperature dependency of dielectric constant, the Curie point thereof was assumed as being 200° C. or more.

EXAMPLE 8

FIGS. 13A to 13E show sectional views showing the steps of manufacturing the semiconductor memory device of Example 8. This Example shows an embodiment wherein an underlying crystal grown from a seed crystal toward the lateral direction was employed to manufacture a ferroelectric memory (FRAM).

Figure 13A:
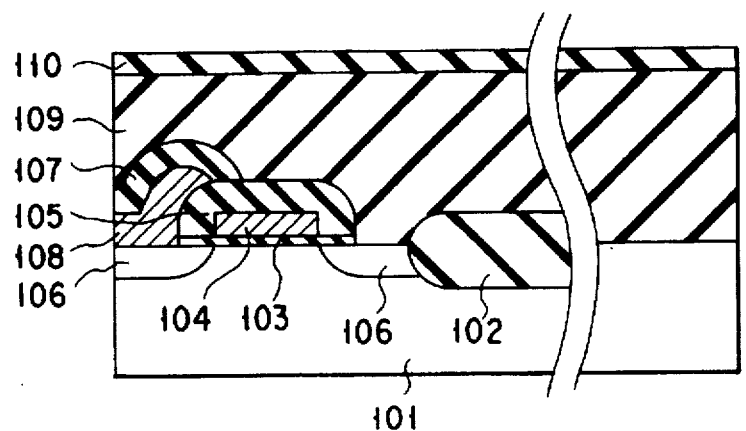
FIGS. 13A to 13E show sectional views showing the steps of manufacturing a memory cell according to Example 8.

FIG. 13A is almost the same as FIG. 9A of the Example 4, but the memory cell arranged in a two-dimensional array is shown on the left side, while a seed crystal-forming portion is inserted at some of the place into the memory array is shown in the right side.

Figure 13B:
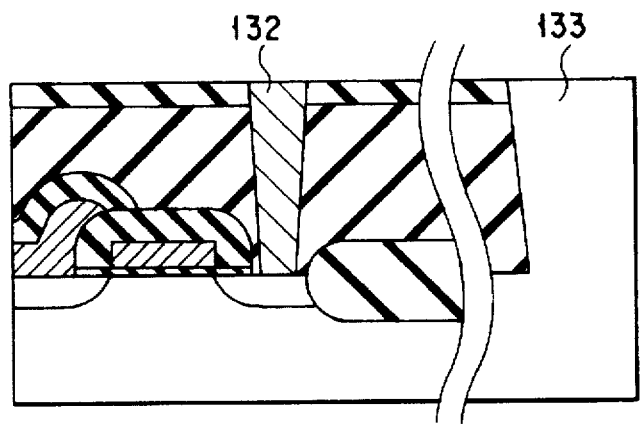
Figure 13C:
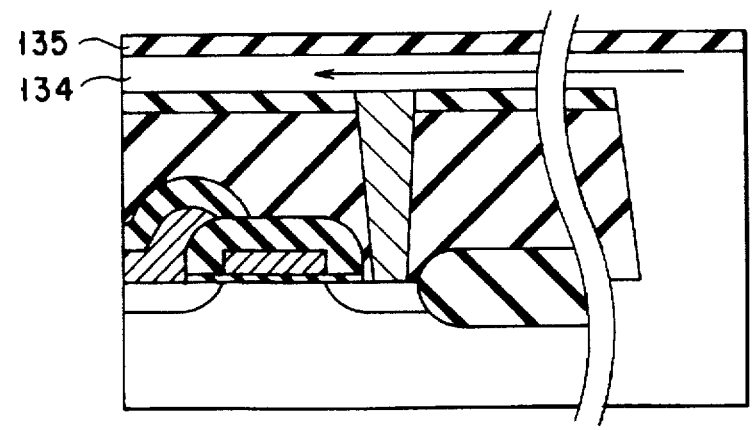

As shown in FIG. 13B, a contact plug 132 made of a polycrystalline tungsten was formed on the memory cell region. On the other hand, an amorphous silicon plug was formed on the seed crystal-forming region and heat treated thereby crystallizing it from the interface of the silicon substrate, thus forming a singlecrystalline seed crystal region 133.

Subsequently, the amorphous silicon layer 134 and the silicon oxide layer 135 were formed on the substrate, and then a heat-scanning using argon laser 10W in output was performed at the velocity of 10 mm/sec thereby performing the fusion-recrystallization of these layers to form a single-crystalline underlying film 134.

Figure 13D:
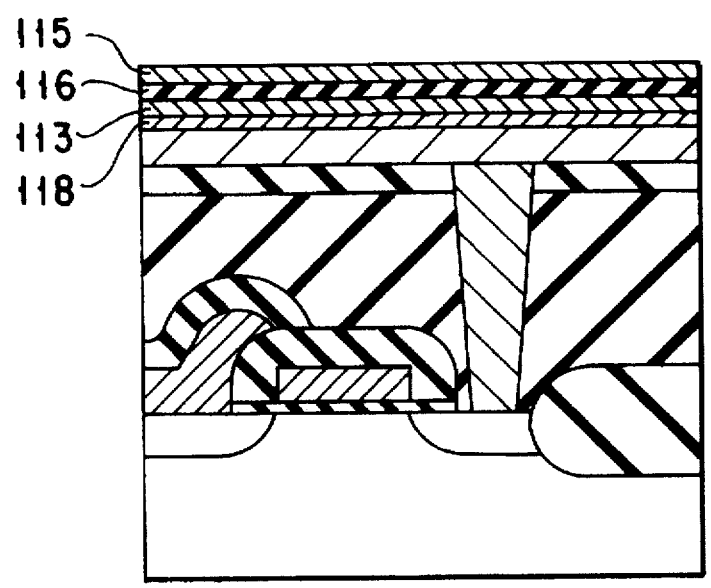

Further, as shown in FIG. 13D, a titanium nitride layer 118 to function as a barrier was deposited on the silicon layer at a substrate temperature of 600° C. by using a reactive sputtering method, a Pt film 113 to function as the lower electrode were grown by means of sputtering while heating the substrate at a temperature of 600° C., and finally BST film (barium content: 70%) 116, which is a perovskite dielectric film, was formed by means of sputtering while heating the substrate at a temperature of 600° C. Furthermore, a Pt upper electrode 115 was deposited.

Figure 13E:
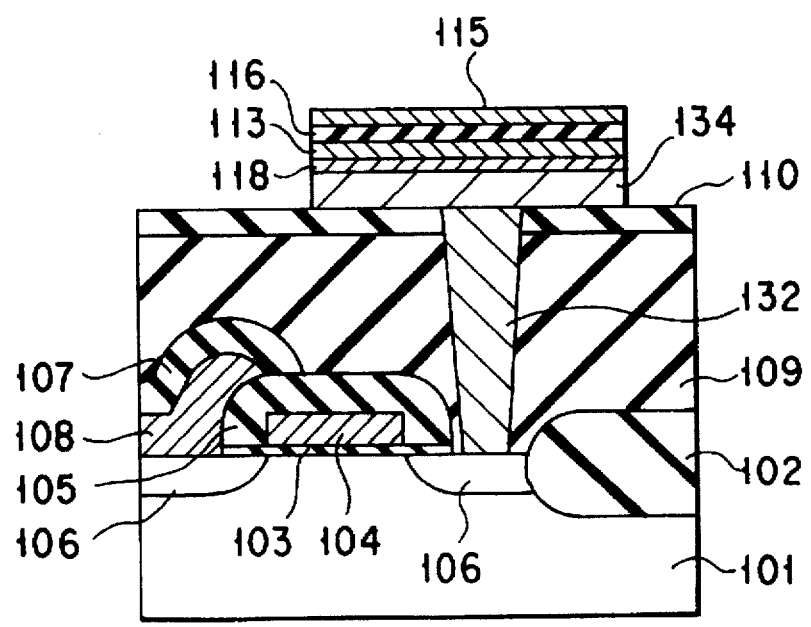

Thereafter, as shown in FIG. 13E, the upper electrode 115 was worked by means of the conventional photolithography and plasma etching to form a capacitor.

When the section of the film was observed using a transmission electron microscope, the orientations of the Si underlying crystal, TiN crystal, Pt crystal and BST crystal thus laminated were found as being well matched with each other, and epitaxially grown in the direction of (111) plane.

When the dielectric properties of the capacitor thus obtained was evaluated, the following features were admitted. Namely, a variation in the accumulated charge depending on the direction of the polarization resulting from definite ferroelectricity was observed. Further, in view of the temperature dependency of dielectric constant, the Curie point thereof was assumed as being 200° C. or more.

This invention is not limited to the above examples. For example, the BST was employed as a capacitor dielectric film in the above examples, but any of ferroelectric or dielectric material having a high dielectric constant may be employed as far as they are made of perovskite or layered perovskite structure. Further, this invention is not limited to a semiconductor memory device, but may be applicable to various semiconductor device having a thin film capacitor. Further, this invention is not limited to a thin film capacitor, but an element having a dielectric film, a piezoelectric element such as a surface acoustic wave element or filter, and a pyroelectric sensor such as infra-red sensor. Other modifications of this invention are of course possible within the scope of this invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device, comprising:
   a silicon substrate;
   a plurality of switching transistors formed on a surface portion of said silicon substrate;
   an insulating layer having an opening and formed on a surface portion of said silicon substrate where said plurality of switching transistors are formed; and
   a plurality of capacitors formed on said insulating layer for accumulating electric charge and connected respectively to said switching transistors via a conductive film buried in said opening of the insulating layer,
   wherein each of said capacitors is provided with a (100) plane-oriented crystalline silicon layer and with a barium titanate type dielectric film coupled with said silicon layer, and
   wherein said switching transistors and said capacitors constitute a plurality of memory cells arranged in a two dimensional pattern.

2. The semiconductor memory device according to claim 1, wherein said dielectric film is grown directly or through a lower electrode on the silicon layer.

3. The semiconductor memory device according to claim 2, wherein said lower electrode is formed of a (100) or (001) plane-orientated conductive layer.

4. The semiconductor memory device according to claim 2, wherein said lower electrode includes at least one of the group consisting of a material having a layered perovskite structure, Pt, TiN, and TiAlN.

5. The semiconductor memory device according to claim 1, wherein said barium titanate type dielectric film is formed with a (100) or (001) plane-oriented crystal.

6. The semiconductor memory device according to claim 1, wherein said barium titanate type dielectric film is barium titanate with a portion of the barium substituted by at least one element selected from the group consisting of Sr and Ca and with a portion of the titanium substituted by at least one material selected from the group consisting of Zr, Hf, Sn, $(Mg_{1/3}Nb_{2/3})$, $(Mg_{1/3}Ta_{2/3})$, $(Zn_{1/3}Nb_{2/3})$, $(Zn_{1/3}Ta_{2/3})$, $(Mg_{1/2}Te_{1/2})$, $(Co_{1/2}W_{1/2})$, $(Mg_{1/2}W_{1/2})$, $(Mn_{1/2}W_{1/2})$, $(Sc_{1/2}Nb_{1/2})$, $(Mn_{1/2}Nb_{1/2})$, $(Sc_{1/2}Ta_{1/2})$, $(Fe_{1/2}Nb_{1/2})$, $(In_{1/2}Nb_{1/2})$, $(Fe_{1/2}Ta_{1/2})$, $(Cd_{1/3}Nb_{2/3})$, $(Co_{1/3}Nb_{2/3})$, $(Ni_{1/3}Nb_{2/3})$, $(Co_{1/3}Ta_{2/3})$, $(Ni_{1/3}Ta_{2/3})$.

7. The semiconductor memory device according to claim 1, wherein said (100) plane-orientated silicon layer is a singlecrystalline silicon layer.

8. The semiconductor memory device according to claim 7, wherein said singlecrystalline silicon layer is an epitaxially grown layer.

9. The semiconductor memory device according to claim 1, wherein each of said capacitor is formed on the surface of isolated individual underlying crystal.

10. The semiconductor memory device according to claim 1, wherein said dielectric film comprises either one of a dielectric material having a high dielectricity and a ferroelectric material, each having either one of a perovskite and a layered perovskite structure.

11. The semiconductor memory device according to claim 1, wherein said thin film capacitor comprises a substrate having at least on its surface a conductive material having a crystal structure belonging to either one of (001) plane of tetragonal system and cubic system, a dielectric film deposited on said substrate through an epitaxial growth and consisting of a dielectric material having a perovskite crystal structure belonging to either one of tetragonal system and cubic system, and an upper electrode formed on said dielectric film, and wherein Curie point inherent to said dielectric material is 150° C. or less, and that a lattice constant ad which is inherent to said dielectric material and represented by a length of a-axis of the perovskite crystal structure and a lattice constant as which is inherent to said conductive material and represented by a length of a-axis of the crystal structure belonging to either one of tetragonal system and cubic system satisfy the following relational expression:

$$1.002 < ad/as < 1.015$$

12. The semiconductor memory device according to claim 11, wherein said dielectric film inherently has a Curie point which is not more than room temperature and a dielectric film made of this dielectric material exhibits a ferroelectricity at room temperature.

13. The semiconductor memory device according to claim 11, wherein said dielectric film has a thickness of 15 nm or more, and a C-axis length Ce of the dielectric material after the epitaxial growth and a C-axis length Co of tetragonal system or a-axis length Co of hexagonal system which is inherent to the dielectric material before the epitaxial growth thereof satisfy the following relational expression:

$$Ce/Co > 1.02$$

14. A method of manufacturing a semiconductor memory device comprising a plurality of two-dimensionally arranged memory cells, each memory cell being constituted by a single switching transistor and a single capacitor having a dielectric film for accumulating electric charge; said method comprising the steps of:
   forming a plurality of switching transistors on a silicon substrate;
   forming an insulating layer on a surface of said silicon substrate to cover said plurality of switching transistors formed thereon;
   forming an opening in said insulating layer;
   forming a (100) plane-oriented crystalline silicon layer on said silicon substrate exposed in said opening; and
   forming a barium titanate type dielectric film coupled with said silicon layer.

15. The method according to claim 14, wherein said crystalline silicon layer is epitaxially grown.

16. The method according to claim 14, wherein said crystalline silicon layer is formed by a solid phase growth from the silicon substrate after selective growth of amorphous silicon.

17. The method according to claim 14, further comprising the step of forming at least one of a barrier and a lower electrode between said crystalline silicon layer and said dielectric film.

* * * * *

UNITED STATES PATENT AND TRADEMARK OFFICE
CERTIFICATE OF CORRECTION

PATENT NO. : 5,739,563
DATED : April 14, 1998
INVENTOR(S) : Takashi KAWAKUBO et al.

It is certified that error appears in the above-indentified patent and that said Letters Patent is hereby corrected as shown below:

Title Page, Item [57], in the Abstract, line 13, "orientationaly" should read --orientationally--.

Claim 4, Col. 25, line 42, "TiAIN" should read --TiAlN--.

Signed and Sealed this

Third Day of August, 1999

Attest:

Attesting Officer

Q. TODD DICKINSON

Acting Commissioner of Patents and Trademarks